(12) United States Patent
Yang

(10) Patent No.: US 11,630,590 B1
(45) Date of Patent: Apr. 18, 2023

(54) METHOD AND APPARATUS FOR PERFORMING ACCESS CONTROL OF MEMORY DEVICE WITH AID OF AGGRESSOR BIT INFORMATION

(71) Applicant: Silicon Motion, Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 17/572,635

(22) Filed: Jan. 11, 2022

(51) Int. Cl.
  *G06F 12/00* (2006.01)
  *G06F 3/06* (2006.01)
  *G06F 12/02* (2006.01)
  *H03M 13/11* (2006.01)

(52) U.S. Cl.
  CPC ............ *G06F 3/0622* (2013.01); *G06F 3/064* (2013.01); *G06F 3/0619* (2013.01); *G06F 3/0659* (2013.01); *G06F 3/0679* (2013.01); *G06F 12/0246* (2013.01); *H03M 13/1111* (2013.01); *G06F 2212/7201* (2013.01)

(58) Field of Classification Search
  CPC ...... G06F 3/0622; G06F 3/0619; G06F 3/064; G06F 3/0659; G06F 3/0679; G06F 12/0246; G06F 2212/7201; H03M 13/1111
  USPC .......................................................... 711/163
  See application file for complete search history.

(56) References Cited

U.S. PATENT DOCUMENTS

| 9,589,659 | B1 * | 3/2017 | Vali .................... G11C 16/3459 |
| 2012/0230104 | A1 | 9/2012 | Kim | |
| 2017/0269995 | A1 * | 9/2017 | Maffeis ............. H03M 13/6325 |

FOREIGN PATENT DOCUMENTS

| CN | 104750571 A | * | 7/2015 | .......... G06F 11/1012 |
| TW | 201403318 A |   | 1/2014 | |
| TW | 201919064 A |   | 5/2019 | |

* cited by examiner

*Primary Examiner* — Mardochee Chery
(74) *Attorney, Agent, or Firm* — Winston Hsu

(57) ABSTRACT

A method and apparatus for performing access control of a memory device with aid of aggressor bit information are provided. The method includes: receiving a first host read command from a host device; sending a first read command to the NV memory in order to try reading first data from a first page; sending a second read command to the NV memory to obtain soft-decoding information and performing a first soft-decoding operation according to the soft-decoding information in order to try obtaining the first data from the first soft-decoding operation; reading multiple bits from at least one aggressor page to be the aggressor bit information; converting the soft-decoding information into adjusted soft-decoding information according to the aggressor bit information of the at least one aggressor page; and performing a second soft-decoding operation according to the adjusted soft-decoding information to obtain the first data from the second soft-decoding operation.

11 Claims, 12 Drawing Sheets

METHOD AND APPARATUS FOR PERFORMING ACCESS CONTROL OF MEMORY DEVICE WITH AID OF AGGRESSOR BIT INFORMATION

BACKGROUND OF THE INVENTION

1. Field of the Invention

The present invention is related to memory control, and more particularly, to a method for performing access control of a memory device with aid of aggressor bit information, and associated apparatus such as the memory device, a memory controller thereof, etc.

2. Description of the Prior Art

Developments in memory technology have enabled the wide application of various portable or non-portable memory devices, such as memory cards respectively conforming to the SD/MMC, CF, MS and XD specifications, and embedded memory devices respectively conforming to the UFS and eMMC specifications. Improving access control of these memory devices remains an issue to be solved in the art.

NAND flash memories may comprise single level cell (SLC) and multiple level cell (MLC) flash memories. In an SLC flash memory, each transistor used as a memory cell may store either of two electrical charge values respectively corresponding to logic values 0 and 1. In comparison, the storage ability of each transistor used as a memory cell in an MLC flash memory may be fully utilized. The transistor in the MLC flash memory can be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in memory devices than an SLC flash memory. The MLC flash memory does have instability issues, however. To ensure that access control of the flash memory in the memory device meets required specifications, a controller of the flash memory may be equipped with some management mechanisms for properly managing data access.

Even memory devices with the above management mechanisms may have certain deficiencies, however. For example, the most extreme access conditions of the memory devices in use may comprise sudden power failure during use and abrupt variation of the ambient temperature that typically occurs in high-latitude countries or regions. When the sudden power failure occurs, a data protection procedure of a memory device cannot be completed, for example, the parity information of a certain protection mechanism cannot be written in time, where one or more previously stored pages in a certain block may be damaged due to the sudden power failure. Typically, a bottleneck of the decoding capability may lead to abandonment of the recovery of the data. In addition, if a similar problem occurs in the case of high-temperature reading and low-temperature writing or the case of low-temperature reading and high-temperature writing, although the writing may be completed to obtain sufficient protection capability, as a certain data recovery procedure is entered, even the data is recovered, the block will still be marked as a bad block, and the available data storage space of the memory device will gradually decrease. One or more other solutions may be proposed to prevent the problems above, but additional problems such as some side effects may be introduced.

Thus, there is a need for a novel method and associated architecture to solve the problems of the related art without introducing any side effect or in a way that is less likely to introduce side effects.

SUMMARY OF THE INVENTION

An objective of the present invention is to provide a method for performing access control of a memory device with aid of aggressor bit information, and to provide an associated apparatus such as the memory device, a controller thereof, etc., to solve the problem mentioned above.

At least one embodiment of the present invention provides a method for performing access control of a memory device with aid of aggressor bit information, wherein the method is applied to a controller of the memory device. The memory device may comprise the controller and a non-volatile (NV) memory, the NV memory may comprise at least one NV memory element (e.g. one or more NV memory elements), and the aforementioned at least one NV memory element may comprise a plurality of blocks. The method may comprise: receiving a first host read command from a host device, wherein the first host read command indicates reading first data at a first logical address; in response to the first host read command, sending a first read command to the NV memory in order to try reading the first data from a first page within a first block among the plurality of blocks according to a first physical address associated with the first logical address, wherein the first physical address indicates the first page within the first block, and reading the first data from the first page is unsuccessful; in response to reading the first data from the first page being unsuccessful, sending a second read command to the NV memory to obtain soft-decoding information regarding the first page and performing a first soft-decoding operation according to the soft-decoding information in order to try obtaining the first data from the first soft-decoding operation, wherein obtaining the first data from the first soft-decoding operation is unsuccessful; in response to obtaining the first data from the first soft-decoding operation being unsuccessful, reading multiple bits from at least one aggressor page that is different from the first page to be the aggressor bit information, wherein the first page corresponds to a first set of memory cells within any NV memory element of the at least one NV memory element, and the at least one aggressor page corresponds to a second set of memory cells adjacent to the first set of memory cells within the any NV memory element; converting the soft-decoding information into adjusted soft-decoding information according to the aggressor bit information of the at least one aggressor page; and performing a second soft-decoding operation according to the adjusted soft-decoding information to obtain the first data from the second soft-decoding operation.

In addition to the method mentioned above, the present invention also provides a memory device, and the memory device comprises an NV memory and a controller. The NV memory is configured to store information, wherein the NV memory may comprise at least one NV memory element (e.g. one or more NV memory elements), and the aforementioned at least one NV memory element may comprise a plurality of blocks. The controller is coupled to the NV memory, and the controller is configured to control operations of the memory device. In addition, the controller comprises a processing circuit, wherein the processing circuit is configured to control the controller according to a plurality of host commands from a host device, to allow the host device to access the NV memory through the controller. For example, the controller receives a first host read command from the host device, wherein the first host read command indicates reading first data at a first logical address, and the first host read command is one of the plurality of host commands; in response to the first host read command, the controller sends a first read command to the NV memory in order to try reading the first data from a first page within a first block among the plurality of blocks according to a first physical address associated with the first logical address, wherein the first physical address indicates the first page within the first block, and reading the first data from the first page is unsuccessful; in response to reading the first data from the first page being unsuccessful, the controller sends a second read command to the NV memory to obtain soft-decoding information regarding the first page and performs a first soft-decoding operation according to the soft-decoding information in order to try obtaining the first data from the first soft-decoding operation, wherein obtaining the first data from the first soft-decoding operation is unsuccessful; in response to obtaining the first data from the first soft-decoding operation being unsuccessful, the controller reads multiple bits from at least one aggressor page that is different from the first page to be the aggressor bit information, wherein the first page corresponds to a first set of memory cells within any NV memory element of the at least one NV memory element, and the at least one aggressor page corresponds to a second set of memory cells adjacent to the first set of memory cells within the any NV memory element; the controller converts the soft-decoding information into adjusted soft-decoding information according to the aggressor bit information of the at least one aggressor page; and the controller performs a second soft-decoding operation according to the adjusted soft-decoding information to obtain the first data from the second soft-decoding operation.

In addition to the method mentioned above, the present invention also provides a controller of a memory device, wherein the memory device comprises the controller and an NV memory. The NV memory may comprise at least one NV memory element (e.g. one or more NV memory elements), and the aforementioned at least one NV memory element may comprise a plurality of blocks. In addition, the controller comprises a processing circuit, wherein the processing circuit is configured to control the controller according to a plurality of host commands from a host device, to allow the host device to access the NV memory through the controller. For example, the controller receives a first host read command from the host device, wherein the first host read command indicates reading first data at a first logical address, and the first host read command is one of the plurality of host commands; in response to the first host read command, the controller sends a first read command to the NV memory in order to try reading the first data from a first page within a first block among the plurality of blocks according to a first physical address associated with the first logical address, wherein the first physical address indicates the first page within the first block, and reading the first data from the first page is unsuccessful; in response to reading the first data from the first page being unsuccessful, the controller sends a second read command to the NV memory to obtain soft-decoding information regarding the first page and performs a first soft-decoding operation according to the soft-decoding information in order to try obtaining the first data from the first soft-decoding operation, wherein obtaining the first data from the first soft-decoding operation is unsuccessful; in response to obtaining the first data from the first soft-decoding operation being unsuccessful, the controller reads multiple bits from at least one aggressor page that is different from the first page to be the aggressor bit information, wherein the first page corresponds to a first set of memory cells within any NV memory element of the at least one NV memory element, and the at least one aggressor page corresponds to a second set of memory cells adjacent to the first set of memory cells within the any NV memory element; the controller converts the soft-decoding information into adjusted soft-decoding information according to the aggressor bit information of the at least one aggressor page; and the controller performs a second soft-decoding operation according to the adjusted soft-decoding information to obtain the first data from the second soft-decoding operation.

The method and the associated apparatus provided by the present invention can ensure that the memory device can properly operate under various situations, where examples of the apparatus mentioned above comprise: the controller, the memory device, etc. In addition, the method and the associated apparatus provided by the present invention can solve the problems of the related art without introducing any side effect or in a way that is less likely to introduce side effects. Additionally, with aid of the aggressor bit information, the method and the associated apparatus provided by the present invention can ensure real-time response from the memory device to the host device, and therefore can improve the overall performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
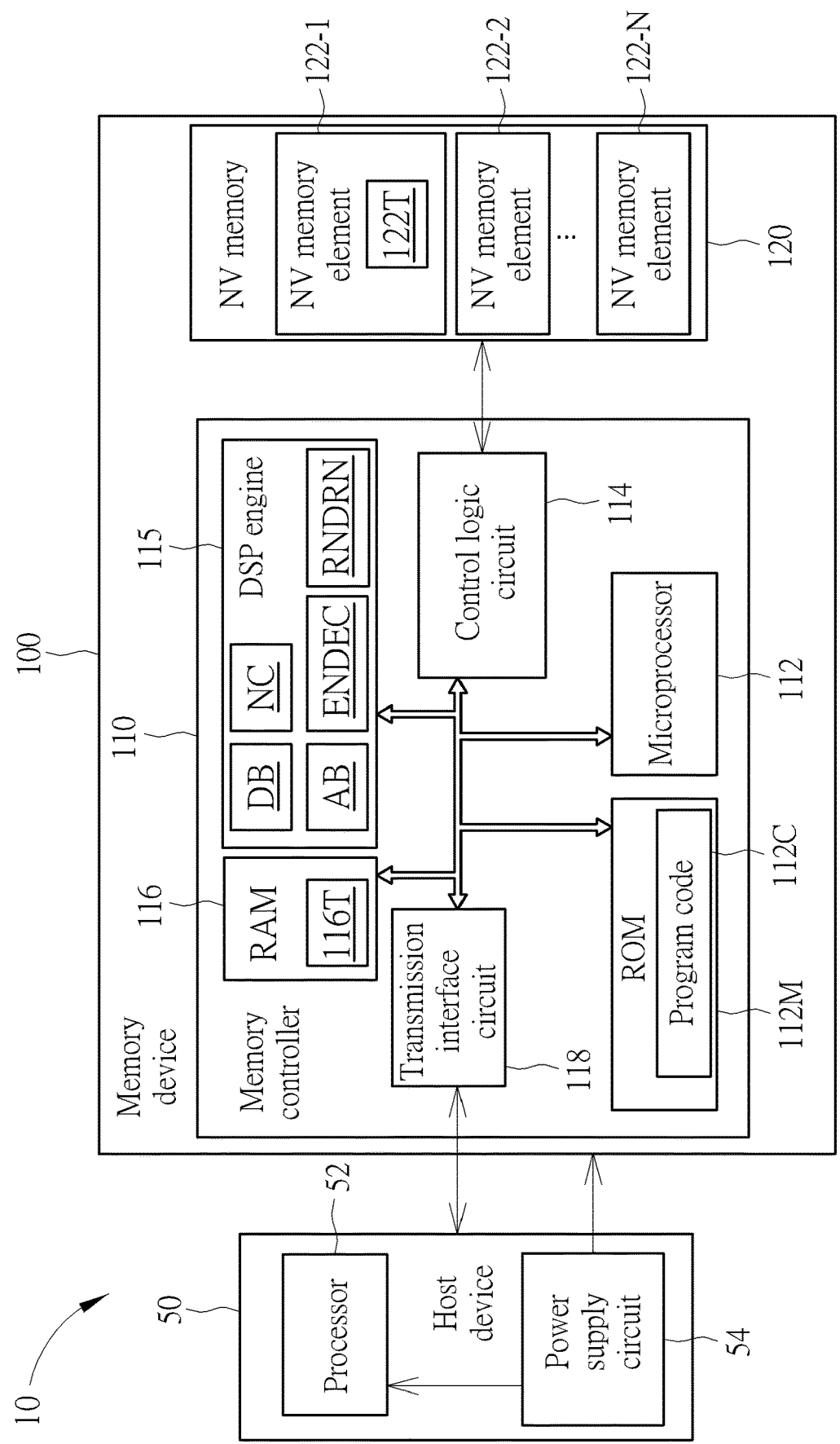
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors), which may be collectively referred to as the processor 52, and the host device 50 may further comprise a power supply circuit 54, coupled to the processor 52. The processor 52 is arranged to control operations of the host device 50, and the power supply circuit 54 is arranged to provide power to the processor 52 and the memory device 100, and output one or more driving voltages to the memory device 100. The memory device 100 can be arranged to provide the host device 50 with storage space, and the one or more driving voltages can be obtained from the host device 50 to be used as the power source of the memory device 100. Examples of the host device 50 may comprise (but are not limited to) multifunctional mobile phone, wearable device, tablet, and personal computer such as desktop computer and laptop computer. Examples of the memory device 100 may comprise (but are not limited to) portable memory devices (e.g. memory cards conforming to SD/MMC, CF, MS, or XD specification), solid state drives (SSD), and various embedded memory devices respectively conforming to UFS and EMMC specification. According to the embodiment, the memory device 100 may comprise a controller such as a memory controller 110, and may further comprise a non-volatile (NV) memory 120, where the controller is arranged to control operations of the memory device 100 and access the NV memory 120, and the NV memory 120 is arranged to store information. The NV memory 120 may comprise at least one NV memory element (e.g. one or more NV memory elements) such as a plurality of NV memory elements 122-1, 122-2, . . . and 122-N, where the symbol "N" can represent a positive integer greater than one. For example, the NV memory 120 may be a flash memory, and the plurality of NV memory elements 122-1, 122-2, . . . and 122-N may be a plurality of flash memory chips or a plurality of flash memory dies, but the invention is not limited thereto.

As shown in FIG. 1, the memory controller 110 may comprise a processing circuit such as a microprocessor 112, a storage unit such as a read-only memory (ROM) 112M, a control logic circuit 114, a digital signal processing (DSP) engine 115, a random access memory (RAM) 116, and a transmission interface circuit 118, where the above elements can be coupled to each other through a bus. The DSP engine 115 may comprise multiple data buffers DB, multiple aggressor buffers AB and a data protection circuit, and the data protection circuit may comprise a noise canceler NC, an encoder and decoder circuit ENDEC and a randomizer and de-randomizer circuit RNDRN, but the invention is not limited thereto. According to some embodiments, one or more sub-circuits of the DSP engine 115 may be integrated into the control logic circuit 114. In the DSP engine 115, the multiple data buffers DB can be arranged to temporarily store some target data pages (e.g. the data pages being processed within the DSP engine 115), the multiple aggressor buffers AB can be arranged to temporarily store aggressor pages such as some other data pages that may have affected the target data pages, and the data protection circuit can be arranged to protect data and/or perform error correction. For example, the encoder and decoder circuit ENDEC may comprise an encoder and a decoder arranged to perform encoding and decoding operations, respectively, and the randomizer and de-randomizer circuit RNDRN may comprise a randomizer and a de-randomizer arranged to perform randomizing and de-randomizing operations, respectively. The noise canceler NC can be arranged to perform noise canceling operations, and more particularly, to cancel the noise due to cell-to-cell interference.

The RAM 116 is implemented by a static random access memory (SRAM), but the invention is not limited thereto. The RAM 116 can be arranged to provide the memory controller 110 with internal storage space. For example, the RAM 116 can be used as a buffer memory to buffer data. More particularly, the RAM 116 may comprise a buffer region that is used as a data buffer 116B, and the data buffer 116B may have a buffer size corresponding to at least one data page (e.g. one or more data pages). In addition, the ROM 112M of the embodiment is arranged to store a program code 112C, and the microprocessor 112 is arranged to execute the program code 112C to control access to the NV memory 120. Please note that, in some examples, the program code 112C can be stored in the RAM 116 or any form of memory. In addition, the transmission interface circuit 118 can conform to a specific communications specification such as Serial Advanced Technology Attachment (SATA) specification, Universal Serial Bus (USB) specification, Peripheral Component Interconnect Express (PCIe) specification, embedded Multi-Media Card (eMMC) specification, or Universal Flash Storage (UFS) specification), and can perform communications according to the specific communications specification.

In the embodiment, the host device 50 can access the memory device 100 by sending host commands and corresponding logical addresses to the memory controller 110. The memory controller 110 receives the host commands and the logical addresses, and translates the host commands into memory operation commands (which may be simply called operation commands), and controls the NV memory with the operation commands to perform reading, writing/programming, etc. on memory units (e.g. data pages) with physical addresses in the NV memory 120, where the physical addresses can be associated with the logical addresses. When the memory controller 110 performs an erase operation on any NV memory element 122-$n$ among the plurality of NV memory elements 122-1, 122-2, . . . and 122-N (the symbol "n" can represent any integer in the interval [1, N]), at least one of multiple blocks of the NV memory device 122-$n$ will be erased, where each block in the multiple blocks can comprise multiple pages (e.g. data pages), and an access operation (e.g. reading or writing) can be performed on one or more pages.

Some implementation details regarding the internal control of the memory device 100 can be further described as follows. According to some embodiments, the processing circuit such as the microprocessor 112 can control the memory controller 110 according to a plurality of host commands from the host device 50, to allow the host device 50 to access the NV memory 120 through the memory controller 110. The memory controller 110 can store data into the NV memory 120 for the host device 50, read the stored data in response to a host command from the host device 50 (e.g. one of the plurality of host commands), and provide the host device 50 with the data read from the NV memory 120. In the NV memory 120 such as the flash memory, the aforementioned at least one NV memory element (e.g. the plurality of NV memory elements 122-1, 122-2, ... and 122-N) may comprise a plurality of blocks such as a first set of physical blocks in the NV memory element 122-1, a second set of physical blocks in the NV memory element 122-2, ... and an $N^{th}$ set of physical blocks in the NV memory element 122-N. The memory controller 110 can be designed to properly manage the plurality of blocks such as these sets of physical blocks.

The memory controller 110 can record, maintain, and/or update block management information regarding the block management in at least one table such as at least one temporary table (e.g. one or more temporary tables) in the RAM 116 and at least one non-temporary table (e.g. one or more non-temporary tables) in the NV memory 120, where the aforementioned at least one temporary table can be collectively referred to as the temporary table 116T, and the aforementioned at least one non-temporary table can be collectively referred to as the non-temporary table 122T. The temporary table 116T may comprise a temporary version of at least a portion (e.g. a part or all) of the non-temporary table 122T. For example, the non-temporary table 122T may comprise at least one logical-to-physical (L2P) address mapping table (e.g. one or more L2P address mapping tables), for recording mapping relationships between multiple logical addresses (e.g. logical block addresses (LBAs) indicating multiple logical blocks, and logical page addresses (LPAs) indicating multiple logical pages within any of the multiple logical blocks) and multiple physical addresses (e.g. physical block addresses (PBAs) indicating multiple physical blocks, and physical page addresses (PPAs) indicating multiple physical pages within any of the multiple physical blocks), and the temporary table 116T may comprise a temporary version of at least one sub-table (e.g. one or more sub-tables) of the at least one L2P address mapping table, where the memory controller 110 (e.g. the microprocessor 112) can perform bi-directional address translation between the host-side storage space (e.g. the logical addresses) of the host device 50 and the device-side storage space (e.g. the physical addresses) of the NV memory 120 within the memory device 100, in order to access data for the host device 50. For better comprehension, the non-temporary table 122T can be illustrated in the NV memory elements 122-1, but the invention is not limited thereto. For example, the non-temporary table 122T can be stored in one or more NV memory elements among the plurality of NV memory elements 122-1, 122-2, ... and 122-N. Additionally, when there is a need, the memory controller 110 can back up the temporary table 116T to the non-temporary table 122T in the NV memory 120 (e.g. one or more NV memory elements among the plurality of NV memory elements 122-1, 122-2, ... and 122-N), and the memory controller 110 may load at least a portion (e.g. a part or all) of the non-temporary table 122T into the RAM 116 to become the temporary table 116T for quick reference.

Figure 2:
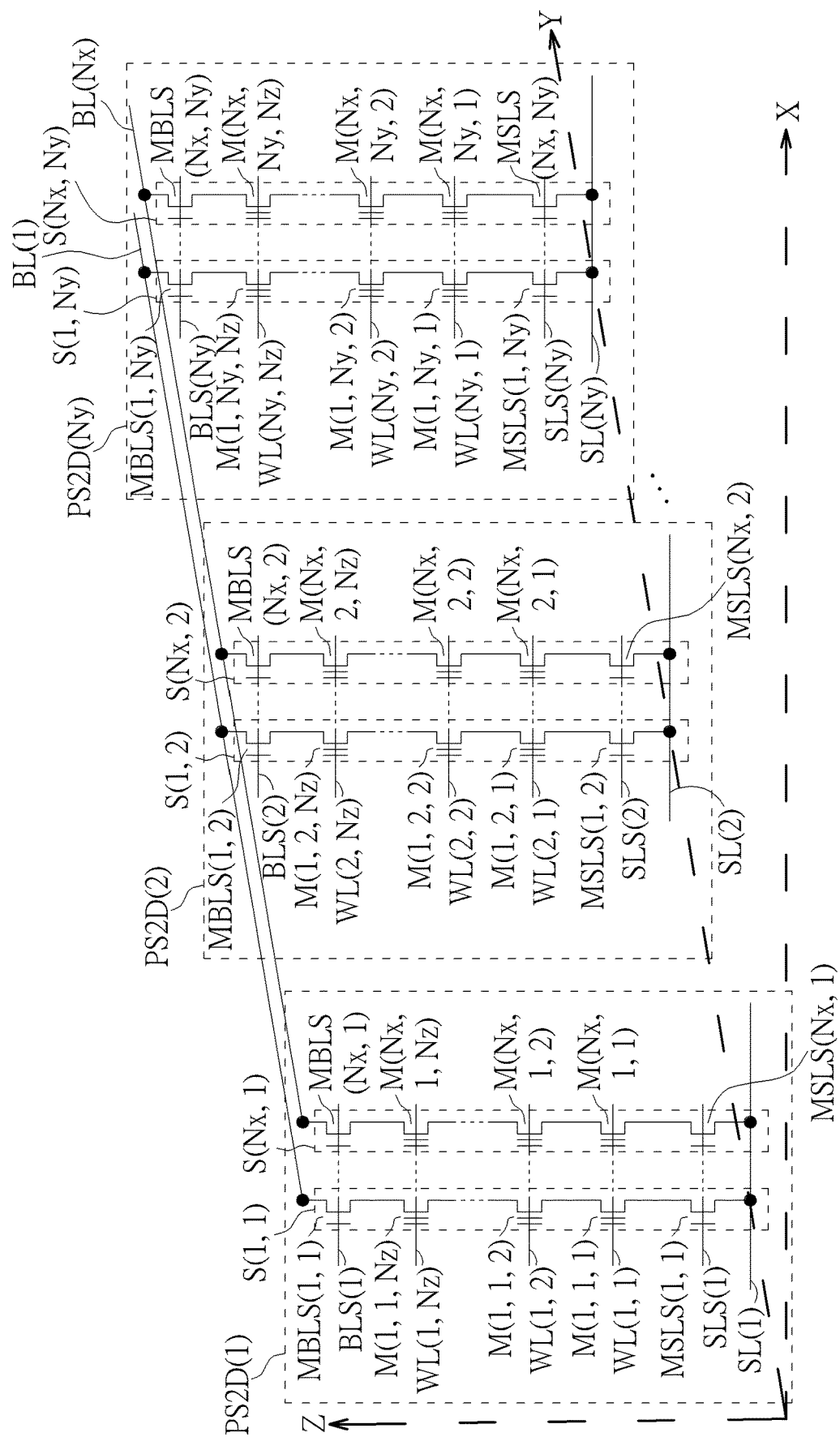
FIG. 2 is a diagram of a three-dimensional (3D) NAND flash memory according to an embodiment of the present invention.

FIG. 2 is a diagram of a three-dimensional (3D) NAND flash memory according to an embodiment of the present invention. For example, any memory element within the aforementioned at least one NV memory element (e.g. the one or more NV memory elements), such as each memory element within the plurality of NV memory elements 122-1, 122-2, ... and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny*Nz) memory cells {{M(1, 1, 1), ..., M(Nx, 1, 1)}, {M(1, 2, 1), ..., M(Nx, 2, 1)}, ..., {M(1, Ny, 1), ..., M(Nx, Ny, 1)}}, {{M(1, 1, 2), ..., M(Nx, 1, 2)}, {M(1, 2, 2), ..., M(Nx, 2, 2)}, ..., {M(1, Ny, 2), ..., M(Nx, Ny, 2)}}, ..., and {{M(1, 1, Nz), ..., M(Nx, 1, Nz)}, {M(1, 2, Nz), ..., M(Nx, 2, Nz)}, ..., {M(1, Ny, Nz), ..., M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS(1, 1), ..., MBLS(Nx, 1)}, {MBLS(1, 2), ..., MBLS(Nx, 2)}, ..., and {MBLS(1, Ny), ..., MBLS(Nx, Ny)} that are arranged in an upper layer above the Nz layers and (Nx*Ny) lower selector circuits {MSLS(1, 1), ..., MSLS(Nx, 1)}, {MSLS(1, 2), ..., MSLS(Nx, 2)}, ..., and {MSLS(1, Ny), ..., MSLS(Nx, Ny)} that are arranged in a lower layer below the Nz layers. In addition, the 3D NAND flash memory may comprise a plurality of bit lines and a plurality of word lines for access control, such as Nx bit lines BL(1), ..., and BL(Nx) that are arranged in a top layer above the upper layer and (Ny*Nz) word lines {WL(1, 1), WL(2, 1), ..., WL(Ny, 1)}, {WL(1, 2), WL(2, 2), ..., WL(Ny, 2)}, ..., and {WL(1, Nz), WL(2, Nz), ..., WL(Ny, Nz)} that are respectively arranged in the Nz layers. Additionally, the 3D NAND flash memory may comprise a plurality of selection lines for selection control, such as Ny upper selection lines BLS(1), BLS(2), ..., and BLS(Ny) that are arranged in the upper layer and Ny lower selection lines SLS(1), SLS(2), ..., and SLS(Ny) that are arranged in the lower layer, and may further comprise a plurality of source lines for providing reference levels, such as Ny source lines SL(1), SL(2), ..., and SL(Ny) that are arranged in a bottom layer below the lower layer.

As shown in FIG. 2, the 3D NAND flash memory may be divided into Ny circuit modules PS2D(1), PS2D(2), ..., and PS2D(Ny) distributed along the Y-axis. For better comprehension, the circuit modules PS2D(1), PS2D(2), ..., and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), ..., and PS2D(Ny) may comprise Nx secondary circuit modules S(1, ny), ..., and S(Nx, ny), where "ny" may represent any integer in the interval [1, Ny]. For example, the circuit module PS2D(1) may comprise Nx secondary circuit modules S(1, 1), ..., and S(Nx, 1), the circuit module PS2D(2) may comprise Nx secondary circuit modules S(1, 2), ..., and S(Nx, 2), ..., and the circuit module PS2D(Ny) may comprise Nx secondary circuit modules S(1, Ny), ..., and S(Nx, Ny). In the circuit module PS2D(ny), any secondary circuit module S(nx, ny) of the secondary circuit modules S(1, ny), ..., and S(Nx, ny) may comprise Nz memory cells M(nx, ny, 1), M(nx, ny, 2), ..., and M(nx, ny, Nz), and may comprise a set of selector circuits corresponding to the memory cells M(nx, ny, 1), M(nx, ny, 2), ..., and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), ..., and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), ..., and M(nx, ny, Nz) may be implemented with a floating gate transistor, where "nz" may represent any integer in the interval [1, Nz], but the present invention is not limited thereto. Further, the upper selector circuits MBLS(1, ny), ..., and MBLS(Nx, ny) in the circuit module PS2D(ny) may perform selection according to the selection signal on the corresponding selection line BLS(ny), and the lower selector circuits MSLS(1, ny), ..., and MSLS(Nx, ny) in the circuit module PS2D(ny) may perform selection according to the selection signal on the corresponding selection line SLS(ny).

Figure 3:
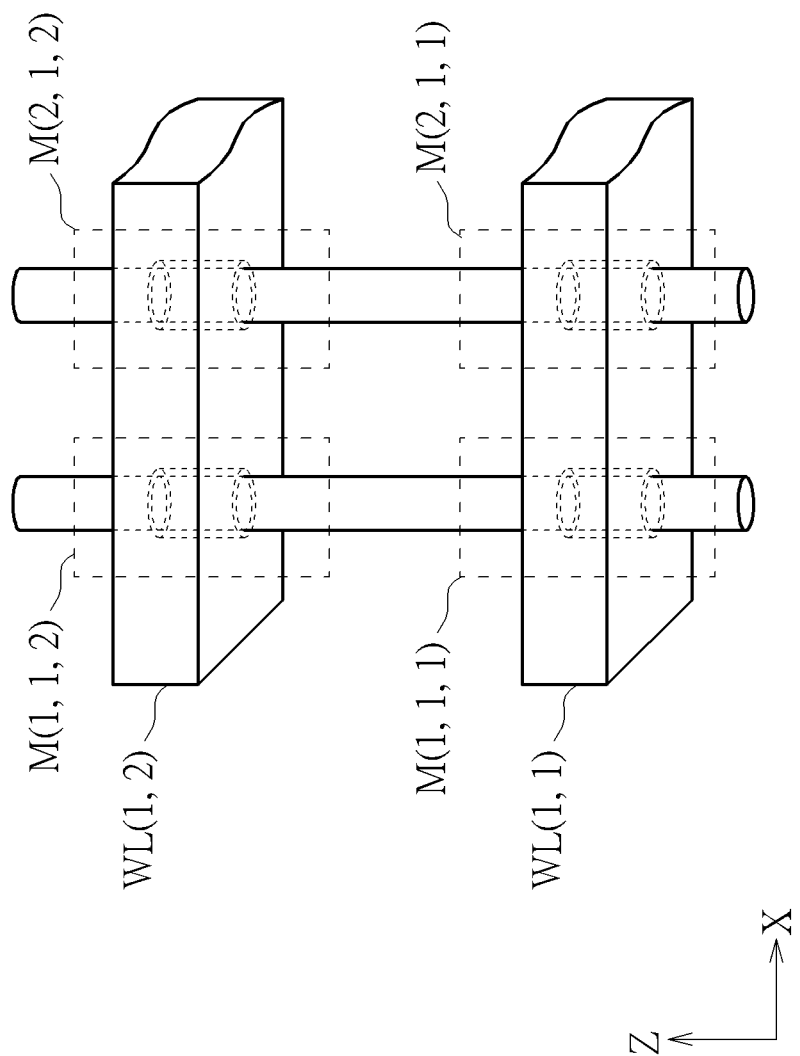
FIG. 3 illustrates some partial structures of the 3D NAND flash memory shown in FIG. 2 according to an embodiment of the present invention.

FIG. 3 illustrates some partial structures of the 3D NAND flash memory shown in FIG. 2 according to an embodiment of the present invention. The 3D NAND flash memory may be designed to have a plurality of rod-shaped partial structures such as that shown in FIG. 3, and the plurality of rod-shaped partial structures may be arranged to pass through the secondary circuit modules {S(1, 1), ..., S(Nx, 1)}, {S(1, 2), ..., S(Nx, 2)}, ..., and {S(1, Ny), ..., S(Nx, Ny)}, respectively. For better comprehension, the plurality of rod-shaped partial structures may be regarded as the channels of the associated transistors of the secondary circuit modules {S(1, 1), ..., S(Nx, 1)}, {S(1, 2), ..., S(Nx, 2)}, ..., and {S(1, Ny), ..., S(Nx, Ny)} within the architecture shown in FIG. 2, respectively, such as the channels of the ordinary transistors for implementing the upper selector circuit MBLS(nx, ny) and the lower selector circuit MSLS(nx, ny) and the channel of the floating gate transistor for implementing the memory cell M(nx, ny, nz). According to some embodiments, the number of the plurality of rod-shaped partial structures may be equal to the total amount (Nx*Ny) of the secondary circuit modules {S(1, 1), ..., S(Nx, 1)}, {S(1, 2), ..., S(Nx, 2)}, ..., and {S(1, Ny), ..., S(Nx, Ny)}, but the present invention is not limited thereto. For example, the arrangement of the plurality of memory cells may be changed, and the number of the plurality of rod-shaped partial structures may be changed correspondingly.

In addition, the 3D NAND flash memory may be designed to have a plurality of pipe-shaped partial structures, and the plurality of pipe-shaped partial structures may be arranged to encircle the plurality of rod-shaped partial structures to form the respective components of the secondary circuit modules {S(1, 1), ..., S(Nx, 1)}, {S(1, 2), ..., S(Nx, 2)}, ..., and {S(1, Ny), ..., S(Nx, Ny)}, and more particularly, to form the respective control gates and the respective floating gates of the plurality of memory cells and the respective gates of the plurality of selector circuits in the architecture shown in FIG. 2. The memory cells {{M(1, 1, 1), M(2, 1, 1), ...}, {M(1, 1, 2), M(2, 1, 2), ...}, ...} and the word lines {WL(1, 1), WL(1, 2), ...} are illustrated in FIG. 3, and the pipe-shaped partial structures shown in FIG. 3 may indicate that there are some additional partial structures surrounding each of the plurality of rod-shaped partial structures, where further details regarding the additional partial structures will be described in the following embodiments.

Figure 4:
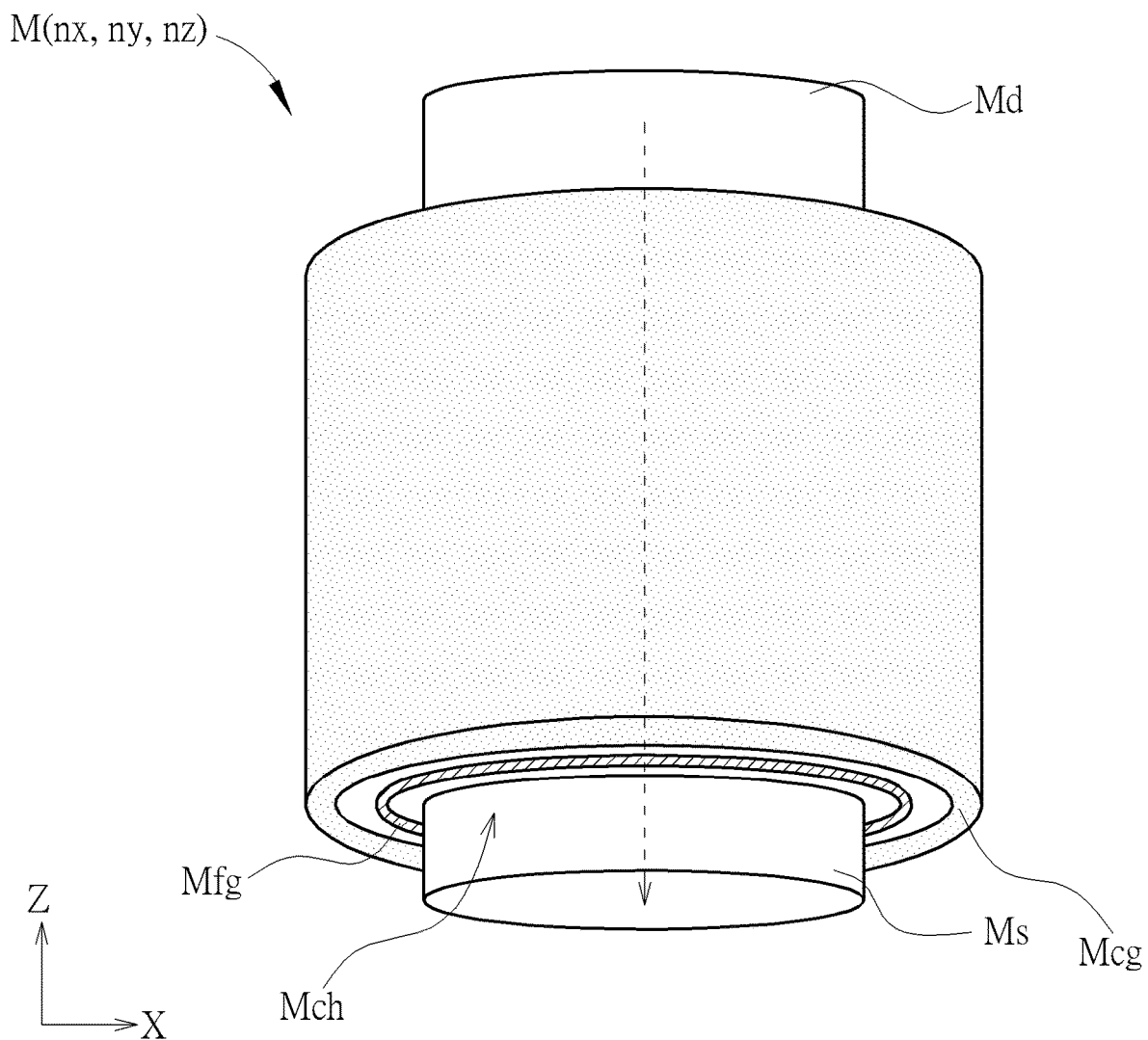
FIG. 4 illustrates some implementation details of one of the memory cells of the 3D NAND flash memory shown in FIG. 2 according to an embodiment of the present invention.

FIG. 4 illustrates some implementation details of one of the memory cells of the 3D NAND flash memory shown in FIG. 2 according to an embodiment of the present invention. As shown in FIG. 4, the memory cell M(nx, ny, nz) may comprise a portion of one of the plurality of rod-shaped partial structures, such as a rod segment within the rod-shaped partial structure corresponding to the secondary circuit module S(nx, ny), and may further comprise some pipe-shaped partial structures having the same symmetry axis. For example, the upper side Md and the lower side Ms of the rod segment may be utilized as the drain and the source of the floating gate transistor for implementing the memory cell M(nx, ny, nz), and a first pipe-shaped partial structure Mfg and a second pipe-shaped partial structure Mcg within these pipe-shaped partial structures may be utilized as the floating gate and the control gate of this floating gate transistor. The other pipe-shaped partial structures within these pipe-shaped partial structures, such as the pipe-shaped partial structure between the rod segment and the first pipe-shaped partial structure Mfg and the pipe-shaped partial structure between the first pipe-shaped partial structure Mfg and the second pipe-shaped partial structure Mcg, may be implemented with one or more insulation materials.

According to some embodiments, any selector circuit of the plurality of selector circuits in the architecture shown in FIG. 2 may be implemented by altering the architecture shown in FIG. 4. For example, the upper side Md and the lower side Ms of the rod segment may be utilized as the drain and the source of the ordinary transistor for implementing this selector circuit, and the second pipe-shaped partial structure Mcg within these pipe-shaped partial structures may be utilized as the gate of the ordinary transistor, where the first pipe-shaped partial structure Mfg should be removed from the one or more insulation materials. As a result, there may be only one pipe-shaped partial structure between the rod segment and the second pipe-shaped partial structure Mcg, but the present invention is not limited thereto.

In the NV memory 120, when a block of any one of the NV memory elements 122-1, 122-2, ... and 122-N serves as an SLC block, each of the physical pages within the block may correspond to one logical page, and each of the memory cells of the page may be configured to store only one bit, wherein one physical page may comprise all of the transistors controlled by a word line (e.g. the memory cells {M(1, 1, Nz), ..., M(Nx, 1, Nz)} corresponding to the word line WL(1, Nz) form a physical page). In addition, when a block of any one of the NV memory elements 122-1, 122-2, ... and 122-N serves as an MLC block, each of the physical pages within the block may correspond to at least two logical pages, and each of the memory cells of the page may be configured to store at least two bits. More particularly, when a block of any one of the NV memory elements 122-1, 122-2, ... and 122-N serves as a triple level cell (TLC) block, each of the physical pages within the block may correspond to three logical pages, and each of the memory cells of the page may be configured to store three bits; when a block of any one of the NV memory elements 122-1, 122-2, ... and 122-N serves as a quadruple level cell (QLC) block, each of the physical pages within the block may correspond to four logical pages, and each of the memory cells of the page may be configured to store four bits; and the rest can be deduced by analogy.

Figure 5:
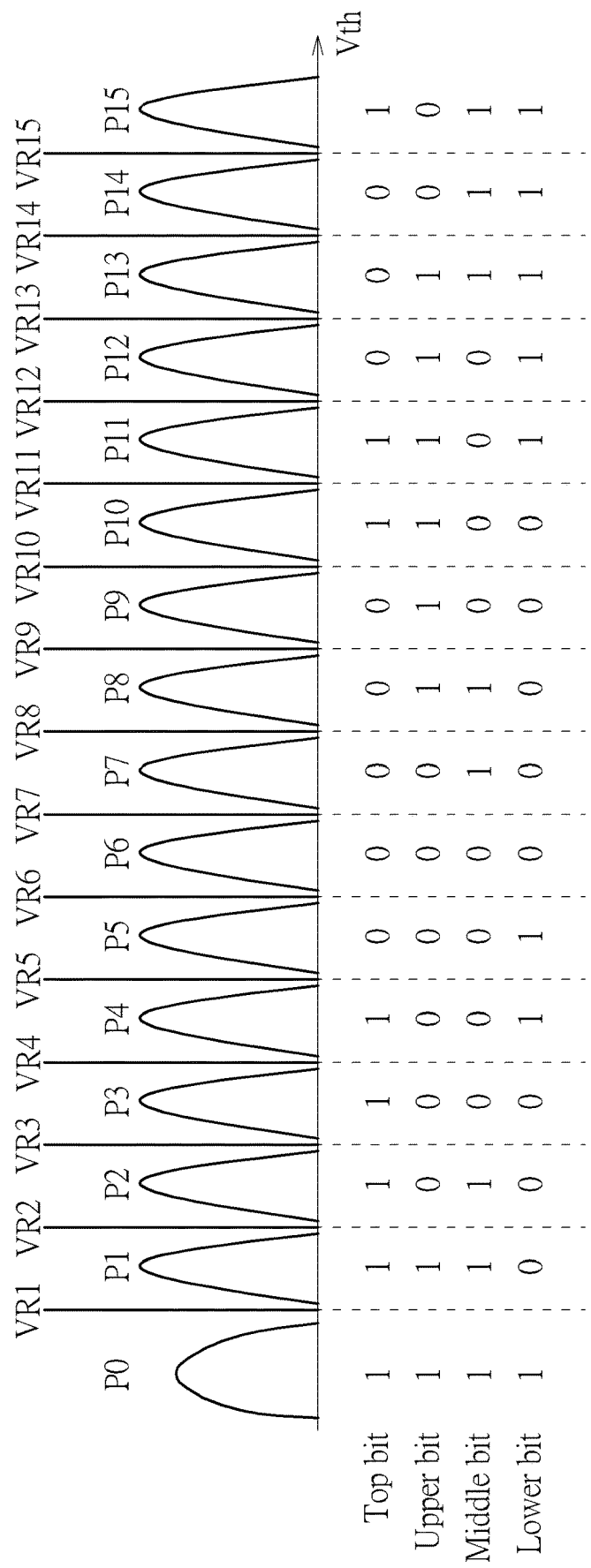
FIG. 5 is a diagram illustrating a plurality of states (e.g. program states) of a memory cell of a quadruple level cell (QLC) block according to an embodiment of the present invention.

FIG. 5 is a diagram illustrating a plurality of states (e.g. program states) of a memory cell of the QLC block according to an embodiment of the present invention. The horizontal axis (labeled "Vth") may represent the read sensing voltage of the NV memory 120, such as a threshold voltage for determining bit information during reading the NV memory 120. The read sensing voltage can also be referred to as the read voltage for brevity. For example, the memory controller 110 can selectively perform one or more of the settings {Vth=VR1, Vth=VR2, . . . , Vth=VR15} to determine the bit information during reading the NV memory 120.

As shown in FIG. 5, any memory cell of the QLC block may be programmed to have any state of sixteen states P0, P1 . . . and P15, and these states may represent different combinations of four bits that are named as a top bit, an upper bit, a middle bit and a lower bit. In the embodiment shown in FIG. 5, when the memory cell is programed to have the state P0, the top bit, the upper bit, the middle bit and the lower bit stored in the memory cell are (1, 1, 1, 1); when the memory cell is programed to have the state P1, the top bit, the upper bit, the middle bit and the lower bit stored in the memory cell are (1, 1, 1, 0); when the memory cell is programed to have the state P2, the top bit, the upper bit, the middle bit and the lower bit stored in the memory cell are (1, 0, 1, 0); when the memory cell is programed to have the state P3, the top bit, the upper bit, the middle bit and the lower bit stored in the memory cell are (1, 0, 0, 0); when the memory cell is programed to have the state P4, the top bit, the upper bit, the middle bit and the lower bit stored in the memory cell are (1, 0, 0, 1); when the memory cell is programed to have the state P5, the top bit, the upper bit, the middle bit and the lower bit stored in the memory cell are (0, 0, 0, 1); when the memory cell is programed to have the state P6, the top bit, the upper bit, the middle bit and the lower bit stored in the memory cell are (0, 0, 0, 0); when the memory cell is programed to have the state P7, the top bit, the upper bit, the middle bit and the lower bit stored in the memory cell are (0, 0, 1, 0); when the memory cell is programed to have the state P8, the top bit, the upper bit, the middle bit and the lower bit stored in the memory cell are (0, 1, 1, 0); when the memory cell is programed to have the state P9, the top bit, the upper bit, the middle bit and the lower bit stored in the memory cell are (0, 1, 0, 0); when the memory cell is programed to have the state P10, the top bit, the upper bit, the middle bit and the lower bit stored in the memory cell are (1, 1, 0, 0); when the memory cell is programed to have the state P11, the top bit, the upper bit, the middle bit and the lower bit stored in the memory cell are (1, 1, 0, 1); when the memory cell is programed to have the state P12, the top bit, the upper bit, the middle bit and the lower bit stored in the memory cell are (0, 1, 0, 1); when the memory cell is programed to have the state P13, the top bit, the upper bit, the middle bit and the lower bit stored in the memory cell are (0, 1, 1, 1); when the memory cell is programed to have the state P14, the top bit, the upper bit, the middle bit and the lower bit stored in the memory cell are (0, 0, 1, 1); and when the memory cell is programed to have the state P15, the top bit, the upper bit, the middle bit and the lower bit stored in the memory cell are (1, 0, 1, 1).

For example, when the top bit is required to be read by the memory controller 110, the memory controller 110 can control the NV memory 120 to apply four read voltages VR5, VR10, VR12 and VR15 to read the memory cell. If the memory cell is conductive when the read voltage VR5 is applied, the top bit is determined to be "1"; if the memory cell is not conductive when the read voltage VR5 is applied, and the memory cell is conductive when the read voltage VR10 is applied, the top bit is determined to be "0"; if the memory cell is not conductive when the read voltage VR10 is applied, and the memory cell is conductive when the read voltage VR12 is applied, the top bit is determined to be "1"; if the memory cell is not conductive when the read voltage VR12 is applied, and the memory cell is conductive when the read voltage VR15 is applied, the top bit is determined to be "0"; and if the memory cell is not conductive when the read voltage VR15 is applied, the top bit is determined to be "1". When the upper bit is required to be read by the memory controller 110, the memory controller 110 can control the NV memory 120 to apply three read voltages VR2, VR8 and VR14 to read the memory cell. If the memory cell is conductive when the read voltage VR2 is applied, the upper bit is determined to be "1"; if the memory cell is not conductive when the read voltage VR2 is applied, and the memory cell is conductive when the read voltage VR8 is applied, the upper bit is determined to be "0"; if the memory cell is not conductive when the read voltage VR8 is applied, and the memory cell is conductive when the read voltage VR14 is applied, the upper bit is determined to be "1"; and if the memory cell is not conductive when the read voltage VR14 is applied, the upper bit is determined to be "0". When the middle bit is required to be read by the memory controller 110, the memory controller 110 can control the NV memory 120 to apply four read voltages VR3, VR7, VR9 and VR13 to read the memory cell. If the memory cell is conductive when the read voltage VR3 is applied, the middle bit is determined to be "1"; if the memory cell is not conductive when the read voltage VR3 is applied, and the memory cell is conductive when the read voltage VR7 is applied, the middle bit is determined to be "0"; if the memory cell is not conductive when the read voltage VR7 is applied, and the memory cell is conductive when the read voltage VR9 is applied, the middle bit is determined to be "1"; if the memory cell is not conductive when the read voltage VR9 is applied, and the memory cell is conductive when the read voltage VR13 is applied, the middle bit is determined to be "0"; and if the memory cell is not conductive when the read voltage VR13 is applied, the middle bit is determined to be "1". When the lower bit is required to be read by the memory controller 110, the memory controller 110 can control the NV memory 120 to apply four read voltages VR1, VR4, VR6 and VR11 to read the memory cell. If the memory cell is conductive when the read voltage VR1 is applied, the lower bit is determined to be "1"; if the memory cell is not conductive when the read voltage VR1 is applied, and the memory cell is conductive when the read voltage VR4 is applied, the lower bit is determined to be "0"; if the memory cell is not conductive when the read voltage VR4 is applied, and the memory cell is conductive when the read voltage VR6 is applied, the lower bit is determined to be "1"; if the memory cell is not conductive when the read voltage VR6 is applied, and the memory cell is conductive when the read voltage VR11 is applied, the lower bit is determined to be "0"; and if the memory cell is not conductive when the read voltage VR11 is applied, the lower bit is determined to be "1".

It is noted that the gray code shown in the lower half of FIG. 5 is for illustrative purposes only, and is not meant to be a limitation of the present invention. In some examples, any suitable gray code can be used in the memory device 100, and the read voltages for determining the top bit, the upper bit, the middle bit and the lower bit may be changed accordingly.

The bit read from the memory cell by using a part of the read voltages VR1, VR2, . . . and VR15 can be regarded as a sign bit. For better comprehension, the memory controller 110 can utilize the data protection circuit to process the sign bits obtained from a set of memory cells (e.g. 4K memory cells), and more particularly, utilize the de-randomizer to perform de-randomizing operations and utilize the decoder to perform error correction operations, for example, perform decoding to generate decoded data to correct errors. However, as the state intervals of the memory cells within the QLC block are typically very small, the states of the memory cells may have serious variations due to one or more issues among various issues (e.g. read disturbance, program disturbance, and data retention) that may occur in the NV memory 120, and the processing result of the error correction operations may be unsuccessful.

According to a soft-decoding control scheme, the memory controller 110 may control the NV memory 120 to further apply additional read voltages to the memory cell to obtain a plurality of soft bits in order to increase the success rate of the error correction operations. For example, in a situation where the decoder fails to decode the sign bits obtained from the memory cells, the memory controller 110 may control the NV memory 120 to use additional read voltages to read the memory cells again to obtain a first group of soft bits. More particularly, the decoder may comprise a low-density parity-check (LDPC) decoder, such as a decoder capable of performing decoding related to LDPC codes, for performing soft-decoding. The decoder (e.g. the LDPC decoder) can decode the sign bits with the first group of soft bits. For example, when the memory controller 110 is trying to read the top page (e.g. the top bits of the memory cells) of the block, the memory controller 110 may control the NV memory 120 to use the additional read voltages (VR5-$\Delta$V), (VR10-$\Delta$V), (VR12-$\Delta$V) and (VR15-$\Delta$V) to obtain the first group of soft bits, where the symbol "$\Delta$V" may represent a predetermined voltage difference (e.g. one of multiple predetermined voltage differences, such as a first predetermined voltage difference selected from the multiple predetermined voltage differences). If the decoder still fails, the memory controller 110 may control the NV memory 120 to use additional read voltages (VR5+$\Delta$V), (VR10+$\Delta$V), (VR12+$\Delta$V) and (VR15+$\Delta$V) to read the memory cells again to obtain a second group of soft bits, and the decoder (e.g. the LDPC decoder) can decode the sign bits with the first group of soft bits and the second group of soft bits. Assuming that instant response from the memory device 100 to the host device 50 is not required, if the decoder still fails, the memory controller 110 may control the NV memory 120 to perform similar operations with another predetermined voltage difference (e.g. another of the multiple predetermined voltage differences), and the rest can be deduced by analogy. Thus, regarding the soft-decoding control scheme, the memory controller 110 may control the NV memory 120 to use one or more sets of additional read voltages to further read the memory cells one or more times to obtain one or more groups of soft bits, for performing soft-decoding, for example, decoding the sign bits with the one or more groups of soft bits, where the soft bit group count of the one or more groups of soft bits and the associated retry count may be limited.

As the states of the memory cells in the QLC block may have serious variations, if the memory controller 110 needs to read data from the QLC block within the NV memory 120, the memory controller 110 may read the memory cells and decode the data many times to try correcting the errors. The error correction may be successful for the case of normal use of the memory device 100, but may be unsuccessful for a certain extreme access condition. Although the error correction may be successful for the case of normal use of the memory device 100, each time the memory controller 110 reading the memory cells needs to transmit a read command to the NV memory 120, and the NV memory 120 needs a read busy time to read the sign bits or soft bits, and therefore, the performance of accessing the high density storage such as QLC blocks in the 3D NAND flash memory may be reduced. The method and the associated apparatus provided by the present invention can ensure that the memory device 100 can properly operate under various situations, and more particularly, can enhance the overall performance.

Figure 6A:
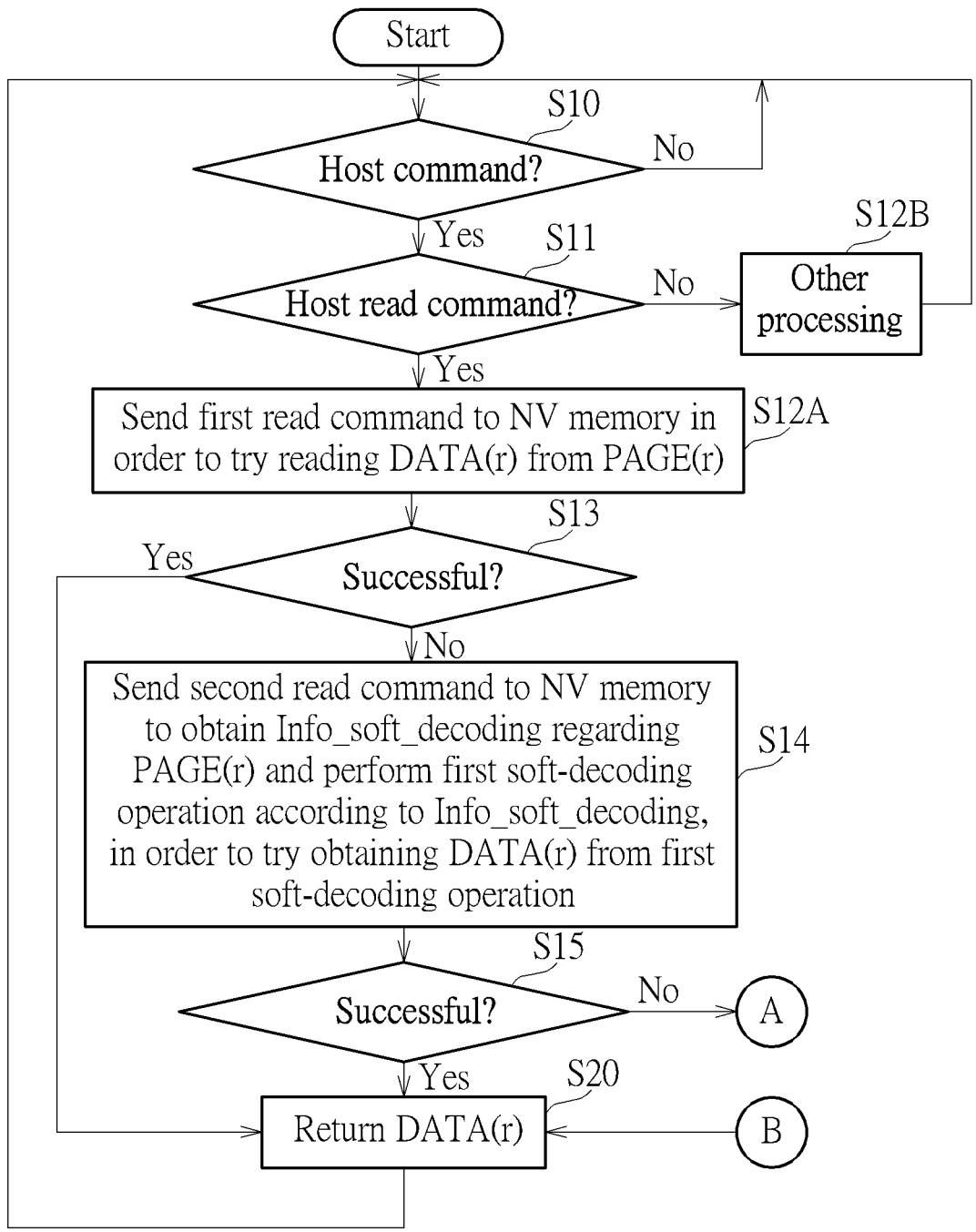
FIG. 6A illustrates a first portion of a flowchart of a method for performing access control of a memory device such as that shown in FIG. 1 with aid of aggressor bit information according to an embodiment of the present invention.
Figure 6B:
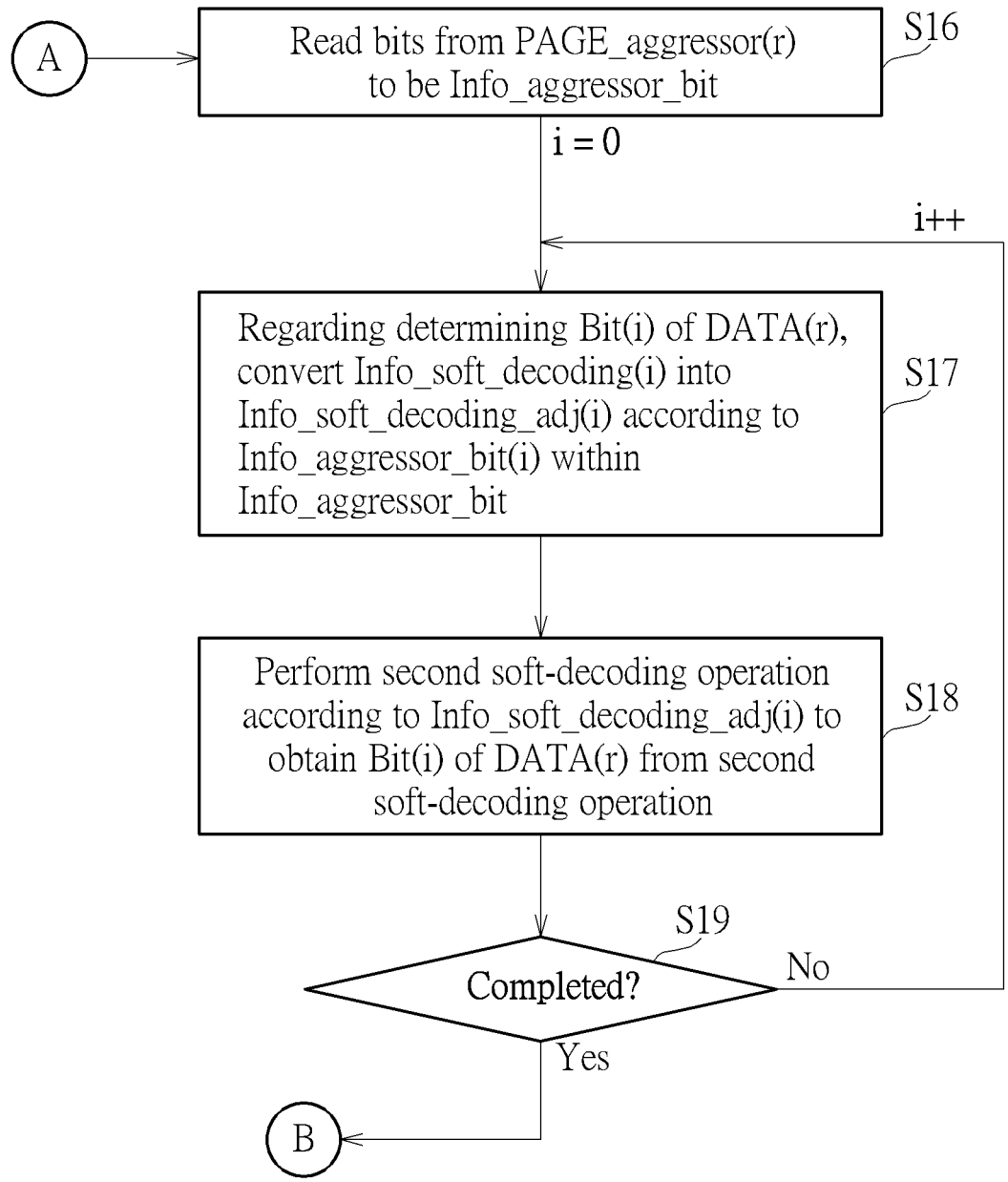
FIG. 6B illustrates a second portion of the flowchart of the method for performing the access control of the memory device with aid of the aggressor bit information.

FIG. 6A and FIG. 6B respectively illustrate a first portion and a second portion of a flowchart of a method for performing access control of a memory device such as that shown in FIG. 1 with aid of aggressor bit information according to an embodiment of the present invention, where the nodes A and B may indicate the connections between respective partial working flows of FIG. 6A and FIG. 6B. The method can be applied to the architecture shown in FIG. 1 (e.g. the electronic device 10, the memory device 100, the memory controller 110, and the microprocessor 112), and can be executed by the memory controller 110 (e.g. the microprocessor 112) of the memory device 100.

In Step S10, the memory controller 110 (e.g. the microprocessor 112) can determine whether a host command (e.g. one of the plurality of host commands) is received. If Yes, Step S11 is entered; if No, Step S10 is entered.

In Step S11, the memory controller 110 (e.g. the microprocessor 112) can determine whether the host command (i.e. the host command that is just received as detected in Step S10) is a host read command. If Yes, Step S12A is entered; if No, Step S12B is entered. The host read command may indicate reading data DATA(r) at a logical address, where the symbol "r" may represent an index corresponding to (e.g. equal to) the number of times that Step S12A is entered. For example, when the host read command such as a first host read command is received from the host device 50, the Step S12A is entered the first time (e.g. r=1); when the host read command such as a second host read command is received from the host device 50, the Step S12A is entered the second time (e.g. r=2); and the rest can be deduced by analogy. For better comprehension, the index r may be regarded as a loop index of at least one main loop comprising Steps S11, S12A, S13, etc., no matter which of multiple subsequent partial loops from Step S13 to Step S20 as shown in FIG. 6A and FIG. 6B is entered, but the present invention is not limited thereto.

In Step S12A, in response to the host read command (i.e. the host read command that is just received as detected in Steps S10 and S11), the memory controller 110 (e.g. the microprocessor 112) can send a first read command to the NV memory 120 in order to try reading the data DATA(r) from a page PAGE(r) within a certain block among the plurality of blocks according to a physical address associated with the logical address, where the physical address may indicate the page PAGE(r) within this block.

For example, in response to the host read command, the memory controller 110 (e.g. the microprocessor 112) can perform address mapping on the logical address according to the aforementioned at least one L2P address mapping table to obtain the physical address associated with the logical address, where the logical address can be one of the multiple logical addresses, and the physical address can be one of the multiple physical addresses. As the aforementioned at least one L2P address mapping table may comprise the mapping relationships between the multiple logical addresses and the multiple physical addresses, the memory controller 110 (e.g.

the microprocessor 112) can perform address mapping on the logical address to determine the physical address.

In Step S12B, the memory controller 110 (e.g. the microprocessor 112) can perform other processing. For example, when the host command (i.e. the host command that is just received as detected in Step S10) is a host write command, the memory controller 110 (e.g. the microprocessor 112) can perform data writing (e.g. data programing) on the NV memory 120.

In Step S13, the memory controller 110 (e.g. the microprocessor 112) can determine whether reading the data DATA(r) from the page PAGE(r) is unsuccessful. If Yes, Step S20 is entered; if No, Step S14 is entered.

In Step S14, in response to reading the data DATA(r) from the page PAGE(r) being unsuccessful, the memory controller 110 (e.g. the microprocessor 112) can send a second read command to the NV memory 120 to obtain soft-decoding information Info_soft_decoding regarding the page PAGE (r) and utilize the decoder such as the LDPC decoder to perform a first soft-decoding operation according to the soft-decoding information Info_soft_decoding, in order to try obtaining the data DATA(r) from the first soft-decoding operation.

In Step S15, the memory controller 110 (e.g. the microprocessor 112) can determine whether obtaining the data DATA(r) from the first soft-decoding operation is unsuccessful. If Yes, Step S20 is entered; if No, Step S16 is entered.

In Step S16, in response to obtaining the data DATA(r) from the first soft-decoding operation being unsuccessful, the memory controller 110 (e.g. the microprocessor 112) can reads multiple bits from the aggressor page PAGE_aggressor(r) corresponding to the page PAGE(r) to be the aggressor bit information Info_aggressor_bit, where the aggressor page PAGE_aggressor(r) may represent at least one aggressor page (e.g. one or more aggressor pages) that is different from the page PAGE(r). For example, the page PAGE(r) may correspond to a first set of memory cells within any NV memory element of the at least one NV memory element (e.g. any of the NV memory elements 122-1, 122-2, and 122-N), and the aforementioned at least one aggressor page such as the aggressor page PAGE_aggressor(r) may correspond to a second set of memory cells adjacent to the first set of memory cells within the any NV memory element.

In the loop comprising Steps S17, S18 and S19, the memory controller 110 (e.g. the microprocessor 112) can convert the soft-decoding information Info_soft_decoding into adjusted soft-decoding information Info_soft_decoding_adj according to the aggressor bit information Info_aggressor_bit of the aforementioned at least one aggressor page such as the aggressor page PAGE_aggressor(r), for example, by using the noise canceler NC, and perform a second soft-decoding operation according to the adjusted soft-decoding information Info_soft_decoding_adj to obtain the data DATA(r) from the second soft-decoding operation, for example, by using the decoder such as the LDPC decoder. More particularly, the operations of converting the soft-decoding information Info_soft_decoding into the adjusted soft-decoding information Info_soft_decoding_adj according to the aggressor bit information Info_aggressor_bit of the at least one aggressor page and performing the second soft-decoding operation according to the adjusted soft-decoding information Info_soft_decoding_adj to obtain the data DATA(r) from the second soft-decoding operation can be performed in a bit-by-bit manner. Therefore, the memory controller 110 can convert the soft-decoding information Info_soft_decoding (e.g. multiple subsets thereof that correspond to the bits {Bit(0), Bit(1), . . . }) such as the soft-decoding information {Info_soft_decoding(0), Info_soft_decoding(1), . . . } into the adjusted soft-decoding information Info_soft_decoding_adj (e.g. multiple subsets thereof that correspond to the bits {Bit(0), Bit(1), . . . }) such as the adjusted soft-decoding information {Info_soft_decoding_adj(0), Info_soft_decoding_adj(1), . . . } according to the aggressor bit information Info_aggressor_bit (e.g. multiple subsets thereof that correspond to the bits {Bit(0), Bit(1), . . . }) such as the aggressor bit information {Info_aggressor_bit(0), Info_aggressor_bit(1), . . . }, respectively, and perform the second soft-decoding operation according to the adjusted soft-decoding information Info_soft_decoding_adj (e.g. the multiple subsets thereof that correspond to the bits {Bit(0), Bit(1), . . . }) such as the adjusted soft-decoding information {Info_soft_decoding_adj(0), Info_soft_decoding_adj(1), . . . } to obtain the data DATA(r) such as the bits {Bit(0), Bit(1), . . . } thereof from the second soft-decoding operation, respectively. For example the symbol "i" may represent a loop index of this loop shown in FIG. 2B, where the initial value of the loop index i can be equal to zero (labeled "i=0" for brevity), and the loop index i can be increased with an increment of one (labeled "i++" for brevity).

In Step S17, regarding determining the bit Bit(i) of the data DATA(r), the memory controller 110 (e.g. the microprocessor 112) can utilize the noise canceler NC to convert the soft-decoding information Info_soft_decoding corresponding to the bit Bit(i), such as the soft-decoding information Info_soft_decoding(i), into the adjusted soft-decoding information Info_soft_decoding_adj corresponding to the bit Bit(i), such as the adjusted soft-decoding information Info_soft_decoding_adj(i), according to the aggressor bit information Info_aggressor_bit corresponding to the bit Bit(i), such as the aggressor bit information Info_aggressor_bit(i).

In Step S18, the memory controller 110 (e.g. the microprocessor 112) can utilize the decoder such as the LDPC decoder to perform the second soft-decoding operation according to the adjusted soft-decoding information Info_soft_decoding_adj corresponding to the bit Bit(i), such as the adjusted soft-decoding information Info_soft_decoding_adj (i), to obtain the bit Bit(i) of the data DATA(r) from the second soft-decoding operation.

In Step S19, the memory controller 110 (e.g. the microprocessor 112) can determine whether obtaining all of the bits {Bit(0), Bit(1), . . . } of the data DATA(r) from the second soft-decoding operation is completed. If Yes, Step S20 is entered; if No, Step S17 is entered.

In Step S20, the memory controller 110 (e.g. the microprocessor 112) can return the data DATA(r) to the host device 50.

For better comprehension, the method may be illustrated with the working flow shown in FIG. 6A and FIG. 6B, but the present invention is not limited thereto. According to some embodiments, one or more steps may be added, deleted, or changed in the working flow shown in FIG. 6A and FIG. 6B.

According to some embodiments, for any bit Bit(i) of the data DATA(r), the soft-decoding information Info_soft_decoding corresponding to the any bit Bit(i), such as the soft-decoding information Info_soft_decoding(i), may comprise a sign bit and multiple soft bits. For example, the memory controller 110 (e.g. the microprocessor 112) can change one or more bits among the sign bit and the multiple soft bits within the soft-decoding information Info_soft_decoding(i) according to the aggressor bit information Info- _aggressor_bit corresponding to the any bit Bit(i), such as the aggressor bit information Info_aggressor_bit(i), to generate the adjusted soft-decoding information Info_soft_decoding_adj corresponding to the any bit Bit(i), such as the adjusted soft-decoding information Info_soft_decoding_adj (i), for obtaining the any bit Bit(i) of the data DATA(r) from the second soft-decoding operation. For brevity, similar descriptions for these embodiments are not repeated in detail here.

Figure 7:
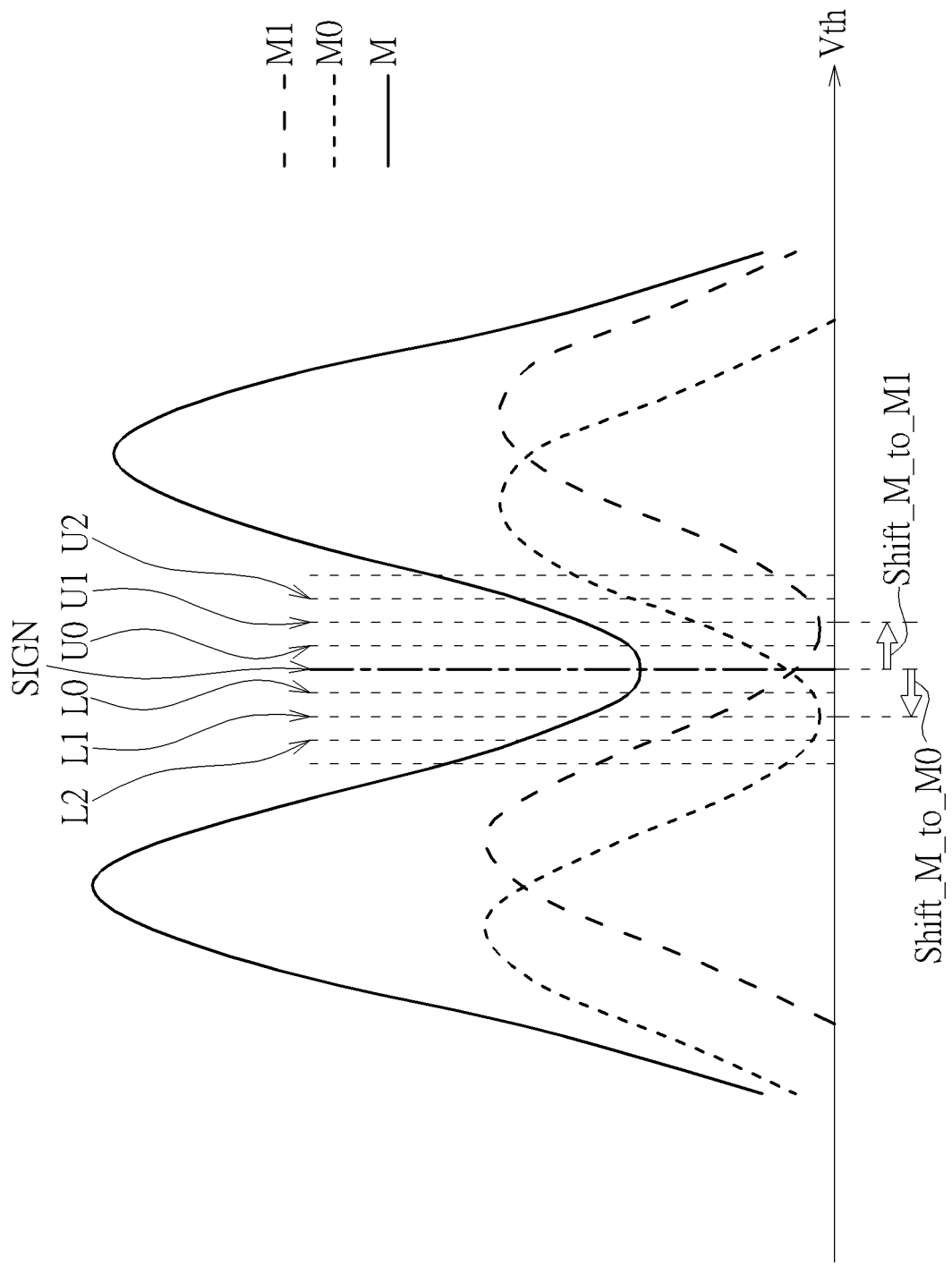
FIG. 7 illustrates an access control scheme of the method shown in FIG. 6A and FIG. 6B according to an embodiment of the present invention.

FIG. 7 illustrates an access control scheme of the method shown in FIG. 6A and FIG. 6B according to an embodiment of the present invention. For better comprehension, it can be assumed that, among the second set of memory cells adjacent to the first set of memory cells, there are two aggressor types (e.g. two types of aggressors) such as a first aggressor type M1 and a second aggressor type M0 for the first set of memory cells, where the first aggressor type M1 may affect a first group of memory cells among the first set of memory cells in a first manner, and the second aggressor type M0 may affect a second group of memory cells among the first set of memory cells in a second manner, but the present invention is not limited thereto. For example, the number of aggressor types may vary.

According to this embodiment, a certain predetermined aggressor type among multiple predetermined aggressor types (e.g. the first aggressor type M1 and the second aggressor type M0) may make a group of memory cells among multiple groups of memory cells (e.g. the first group of memory cells and the second group of memory cells) within the first set of memory cells to have a distribution shift of a partial read sensing voltage distribution corresponding to this predetermined aggressor type with respect to a read sensing voltage distribution of a superset M, where the superset M may comprise the first set of memory cells within the any NV memory element (e.g. this read sensing voltage distribution may be regarded as a read sensing voltage distribution of at least the first set of memory cells within the any NV memory element, but the present invention is not limited thereto. For example, the superset M may comprise the any NV memory element, and this read sensing voltage distribution can be equal to a global read sensing voltage distribution of the any NV memory element. For another example, the superset M may comprise the NV memory 120, and this read sensing voltage distribution can be equal to an overall read sensing voltage distribution of the NV memory 120.

As shown in FIG. 7, the first aggressor type M1 may make the first group of memory cells to have a first partial read sensing voltage distribution (e.g. the curve corresponding to the legend of "M1"), and more particularly, to have a first distribution shift Shift_M_to_M1 of the first partial read sensing voltage distribution corresponding to the first aggressor type M1 with respect to the read sensing voltage distribution of the superset M. For example, for a victim memory cell in the first group of memory cells, when an aggressor memory cell adjacent to this victim memory cell has been programed to have a higher state along the horizontal axis, this aggressor memory cell may make the state of this victim memory cell shift toward the positive direction corresponding the higher state, where the shifting amount may be equal to the first distribution shift Shift_M_to_M1. In addition, the second aggressor type M0 may make the second group of memory cells to have a second partial read sensing voltage distribution (e.g. the curve corresponding to the legend of "M0"), and more particularly, to have a second distribution shift Shift_M_to_M0 of the second partial read sensing voltage distribution corresponding to the second aggressor type M0 with respect to the read sensing voltage distribution of the superset M. For example, for a victim memory cell in the first group of memory cells, when an aggressor memory cell adjacent to this victim memory cell has been programed or erased to have a lower state along the horizontal axis, this aggressor memory cell may make the state of this victim memory cell shift toward the negative direction corresponding the lower state, where the shifting amount may be equal to the second distribution shift Shift M to M0.

Regarding determining any bit Bit(i) of the data DATA(r), an operation of converting the soft-decoding information Info_soft_decoding corresponding to the any bit Bit(i) (e.g. the soft-decoding information Info_soft_decoding(i)) into the adjusted soft-decoding information Info_soft_decoding_adj corresponding to the any bit Bit(i) (e.g. the adjusted soft-decoding information Info_soft_decoding_adj(i)) according to at least one associated bit (e.g. the aggressor bit information Info_aggressor_bit(i)) within the aggressor bit information Info_aggressor_bit of the at least one aggressor page can be performed based on the distribution shift of the partial read sensing voltage distribution corresponding to a certain predetermined aggressor type with respect to the read sensing voltage distribution of at least the first set of memory cells within the any NV memory element (e.g. the overall read sensing voltage distribution of the NV memory 120). For example, when this predetermined aggressor type represents the first aggressor type M1, the distribution shift may represent the first distribution shift Shift_M_to_M1. For another example, when this predetermined aggressor type represents the second aggressor type M0, the distribution shift may represent the second distribution shift Shift_M_to_M0.

For better comprehension, the read sensing voltage SIGN may represent a read sensing voltage for determining the sign bit, and the read sensing voltages U0, U1, U2, etc. that are greater than the read sensing voltage SIGN and the read sensing voltages L0, L1, L2, etc. that are less than the read sensing voltage SIGN may represent read sensing voltages for determining the soft bits, but the present invention is not limited thereto. For example, the read sensing voltages for determining the soft bits and/or the number of these read sensing voltages may vary. For brevity, similar descriptions for this embodiment are not repeated in detail here.

Figure 8:
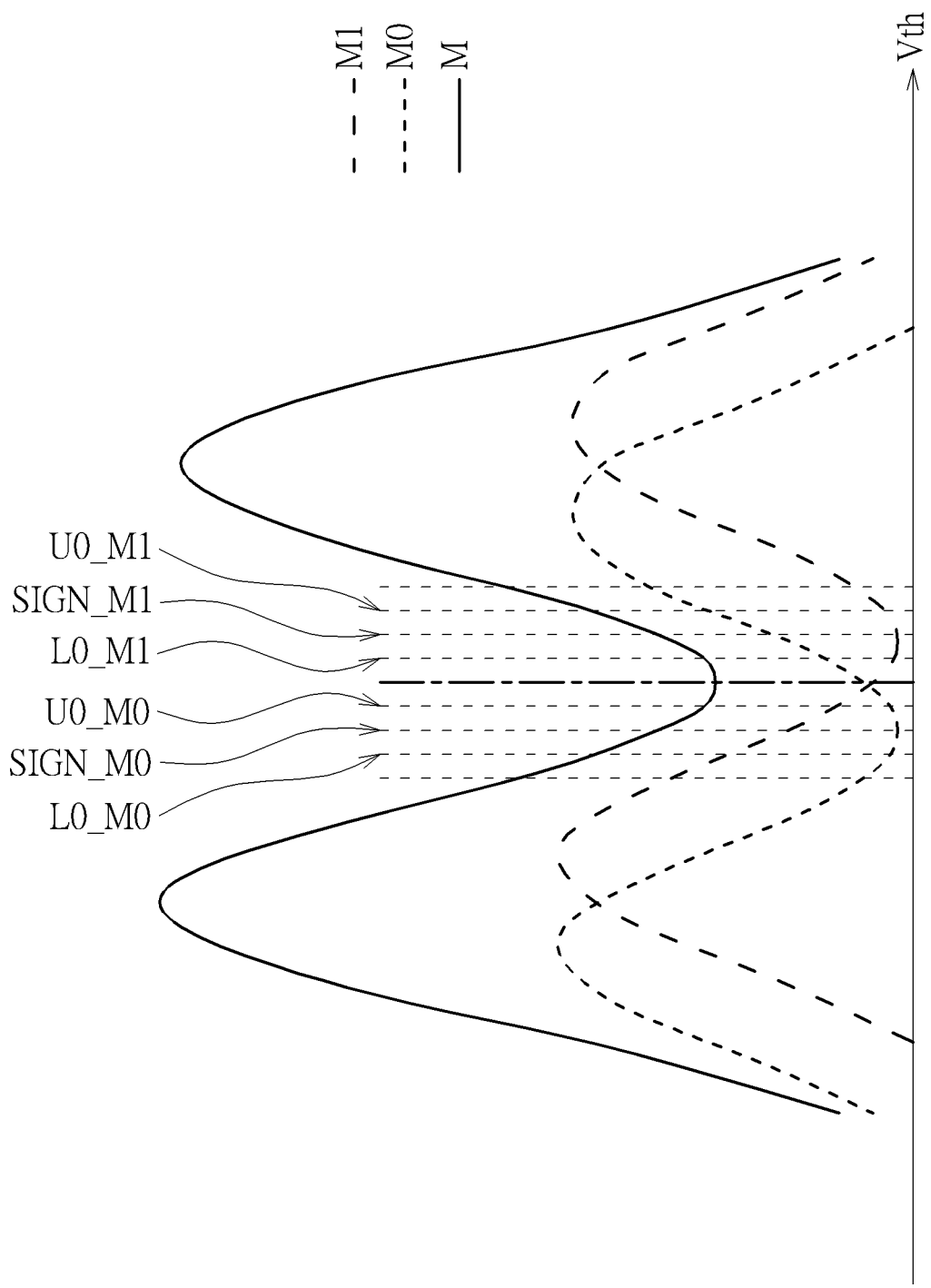
FIG. 8 illustrates some implementation details of the access control scheme shown in FIG. 7 according to an embodiment of the present invention.

FIG. 8 illustrates some implementation details of the access control scheme shown in FIG. 7 according to an embodiment of the present invention. The memory controller 110 (e.g. the microprocessor 112) can control the NV memory 120 to use the read sensing voltages U0, U1 and U2 corresponding to the soft-decoding control scheme as the read sensing voltages L0_M1, SIGN_M1 and U0_M1 corresponding to the second soft-decoding operation, respectively, and control the NV memory 120 to use the read sensing voltages L0, L1 and L2 corresponding to the soft-decoding control scheme as the read sensing voltages U0_M0, SIGN_M0 and L0_M0 corresponding to the second soft-decoding operation, respectively. For brevity, similar descriptions for this embodiment are not repeated in detail here.

According to some embodiments, the soft-decoding information corresponding to the superset M may comprise 1H2S (one hard-information bit, two soft-information bits) soft-decoding information for soft-decoding. If the soft-decoding is performed without considering the multiple predetermined aggressor types (e.g. the first aggressor type M1 and the second aggressor type M0), many high reliability errors (HREs) may occur, causing the error correction capability of the soft-decoding to be significantly reduced. The present invention apparatus (e.g. the memory device 100 and the memory controller 110) operating according to the method can classify the 1H2S soft-decoding information into 1H1S (one hard-information bit, one soft-information bit) soft-decoding information corresponding to the first partial read sensing voltage distribution and 1H1S soft-decoding information corresponding to the second partial read sensing voltage distribution, for example, by using the noise canceler NC, and then merge back into the complete 1H1S soft-decoding. Since the number of HREs has been significantly reduced, even though the soft-information bit count has been reduced, the error correction capability can be greatly increased. For example, operations of the noise canceler NC can be designed according to the following pseudo code expression:

if (Aggressor==M1) {
   SIGN M1=U1;
   L0 M1=U0;
   U0 M1=U2;
}
else if (Aggressor==M0) {
   SIGN M0=L1;
   L0 M0=L2;
   U0 M0=L0;
} but the present invention is not limited thereto. In some examples, the soft-information bit count of the soft-decoding information corresponding to the superset M can be increased, and the soft-information bit count of the soft-decoding information corresponding to any partial read sensing voltage distribution among multiple partial read sensing voltage distribution can be increased correspondingly, and therefore, the error correction capability can be further increased. For brevity, similar descriptions for these embodiments are not repeated in detail here.

Figure 9:
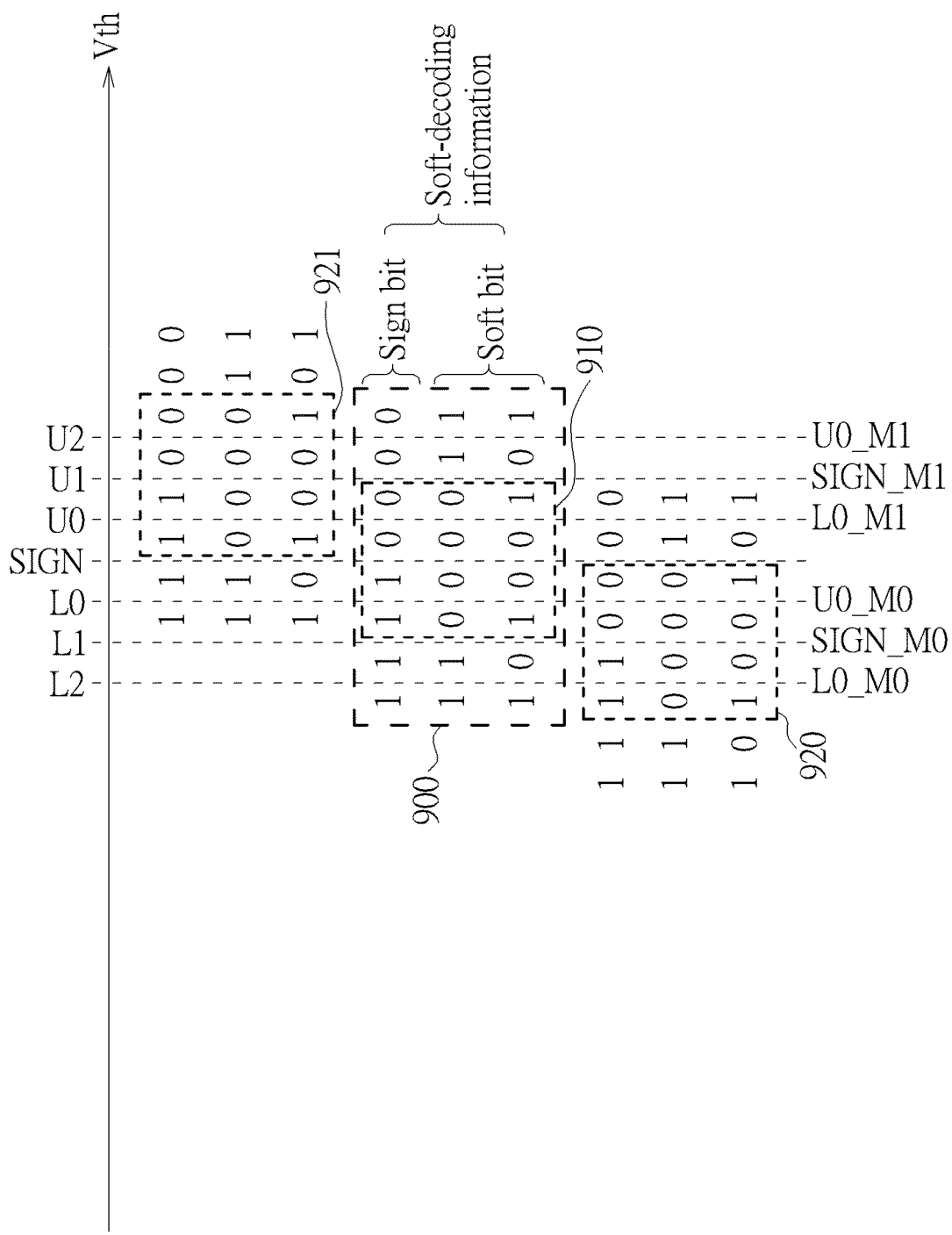
FIG. 9 illustrates a soft-decoding information conversion control scheme of the method shown in FIG. 6A and FIG. 6B according to an embodiment of the present invention.

FIG. 9 illustrates a soft-decoding information conversion control scheme of the method shown in FIG. 6A and FIG. 6B according to an embodiment of the present invention. As shown in FIG. 9, a series of predetermined voltage range codes 900 such as eight voltage range codes $\{\{1, 1, 1\}, \{1, 1, 0\}, \{1, 0, 1\}, \{1, 0, 0\}, \{0, 0, 0\}, \{0, 0, 1\}, \{0, 1, 0\}, \{0, 1, 1\}\}$ can be used for representing a series of voltage ranges of the read sensing voltage Vth of the NV memory 120, respectively, where the series of predetermined voltage range codes 900 can be taken as an example of the soft-decoding information, but the present invention is not limited thereto. More particularly, any predetermined voltage range code among the series of predetermined voltage range codes 900 may comprises a sign bit and multiple soft bits such as two soft bits. In addition, a first copy of the series of predetermined voltage range codes 900 may have the same shift as the first distribution shift Shift_M_to_M1, and a second copy of the series of predetermined voltage range codes 900 may have the same shift as the second distribution shift Shift_M_to_M0. For example, the main predetermined voltage range codes 921 in the first copy can be obtained from shifting the main predetermined voltage range codes 910 within the series of predetermined voltage range codes 900 with the first distribution shift Shift_M_to_M1, and the main predetermined voltage range codes 920 in the second copy can be obtained from shifting the main predetermined voltage range codes 910 within the series of predetermined voltage range codes 900 with the second distribution shift Shift_M_to_M0.

For any bit Bit(i) of the data DATA(r), the soft-decoding information Info_soft_decoding corresponding to the any bit Bit(i), such as the soft-decoding information Info_soft_decoding(i), may comprise a first predetermined voltage range code among the series of predetermined voltage range codes 900, such as one of the eight voltage range codes $\{\{1, 1, 1\}, \{1, 1, 0\}, \{1, 0, 1\}, \{1, 0, 0\}, \{0, 0, 0\}, \{0, 0, 1\}, \{0, 1, 0\}, \{0, 1, 1\}\}$. During converting the soft-decoding information Info_soft_decoding into the adjusted soft-decoding information Info_soft_decoding_adj according to the aggressor bit information Info_aggressor_bit of the at least one aggressor page, regarding determining the any bit Bit(i) of the data DATA(r), the memory controller 110 (e.g. the microprocessor 112) can switch from the first predetermined voltage range code to a second predetermined voltage range code among the series of predetermined voltage range codes 900 according to at least one corresponding bit (e.g. the aggressor bit information Info_aggressor_bit(i)) within the aggressor bit information Info_aggressor_bit, for being used as the adjusted soft-decoding information Info_soft_decoding_adj corresponding to the any bit Bit(i), such as the adjusted soft-decoding information Info_soft_decoding_adj(i). In a situation where any of the first copy and the second copy is a shifted version of the series of predetermined voltage range codes 900, the second predetermined voltage range code can be another of the eight voltage range codes $\{\{1, 1, 1\}, \{1, 1, 0\}, \{1, 0, 1\}, \{1, 0, 0\}, \{0, 0, 0\}, \{0, 0, 1\}, \{0, 1, 0\}, \{0, 1, 1\}\}$.

As shown in FIG. 9, the main predetermined voltage range codes 921 such as the four voltage range codes $\{\{1, 0, 1\}, \{1, 0, 0\}, \{0, 0, 0\}, \{0, 0, 1\}\}$ corresponding four voltage ranges (e.g. the voltage ranges divided by the read sensing voltages L0_M1, SIGN_M1 and U0_M1) can be associated with the right half of the series of predetermined voltage range codes 900, such as the four voltage range codes $\{\{0, 0, 0\}, \{0, 0, 1\}, \{0, 1, 0\}, \{0, 1, 1\}\}$ corresponding the same four voltage ranges (e.g. the voltage ranges divided by the read sensing voltages U0, U1 and U2). As a result, the second predetermined voltage range code can be one of the main predetermined voltage range codes 921 (e.g. any of the four voltage range codes $\{\{1, 0, 1\}, \{1, 0, 0\}, \{0, 0, 0\}, \{0, 0, 1\}\}$) for the case of the first aggressor type M1. In addition, the main predetermined voltage range codes 920 such as the four voltage range codes $\{\{1, 0, 1\}, \{1, 0, 0\}, \{0, 0, 0\}, \{0, 0, 1\}\}$ corresponding four voltage ranges (e.g. the voltage ranges divided by the read sensing voltages L0_M0, SIGN_M0 and U0_M0) can be associated with the left half of the series of predetermined voltage range codes 900, such as the four voltage range codes $\{\{1, 1, 1\}, \{1, 1, 0\}, \{1, 0, 1\}, \{1, 0, 0\}\}$ corresponding the same four voltage ranges (e.g. the voltage ranges divided by the read sensing voltages L2, L1 and L0). As a result, the second predetermined voltage range code can be one of the main predetermined voltage range codes 920 (e.g. any of the four voltage range codes $\{\{1, 0, 1\}, \{1, 0, 0\}, \{0, 0, 0\}, \{0, 0, 1\}\}$) for the case of the second aggressor type M0.

For the case of the first aggressor type M1, in a situation where the second predetermined voltage range code can be one of the main predetermined voltage range codes 921, the memory controller 110 (e.g. the microprocessor 112) can convert the first predetermined voltage range code (e.g. any of the four voltage range codes $\{\{0, 0, 0\}, \{0, 0, 1\}, \{0, 1, 0\}, \{0, 1, 1\}\}$) in the series of predetermined voltage range codes 900 into the second predetermined voltage range code (e.g. a corresponding voltage range code of the four voltage range codes $\{\{1, 0, 1\}, \{1, 0, 0\}, \{0, 0, 0\}, \{0, 0, 1\}\}$) corresponding to the same voltage range among the main predetermined voltage range codes 921, and more particularly, convert the four voltage range codes $\{\{0, 0, 0\}, \{0, 0, 1}, {0, 1, 0}, {0, 1, 1}} into the four voltage range codes {{1, 0, 1}, {1, 0, 0}, {0, 0, 0}, {0, 0, 1}} in Step S17 in different iterations of the loop shown in FIG. 6B, respectively. For the case of the second aggressor type M0, in a situation where the second predetermined voltage range code can be one of the main predetermined voltage range codes 920, the memory controller 110 (e.g. the microprocessor 112) can convert the first predetermined voltage range code (e.g. any of the four voltage range codes {{1, 1, 1}, {1, 1, 0}, {1, 0, 1}, {1, 0, 0}}) in the series of predetermined voltage range codes 900 into the second predetermined voltage range code (e.g. a corresponding voltage range code of the four voltage range codes {{1, 0, 1}, {1, 0, 0}, {0, 0, 0}, {0, 0, 1}}) corresponding to the same voltage range among the main predetermined voltage range codes 920, and more particularly, convert the four voltage range codes {{1, 1, 1}, {1, 1, 0}, {1, 0, 1}, {1, 0, 0}} into the four voltage range codes {{1, 0, 1}, {1, 0, 0}, {0, 0, 0}, {0, 0, 1}} in Step S17 in different iterations of the loop shown in FIG. 6B, respectively.

For any predetermined aggressor type of the multiple predetermined aggressor types, a ranking shift of the ranking of the second predetermined voltage range code with respect to the first predetermined voltage range code among the series of predetermined voltage range codes 900 can be associated with the distribution shift of the partial read sensing voltage distribution corresponding to this predetermined aggressor type with respect to the read sensing voltage distribution of the super set M (e.g. at least the first set of memory cells within the any NV memory element). As shown in FIG. 9, for the first aggressor type M1, a first ranking shift of the ranking of the second predetermined voltage range code (e.g. the voltage range code {1, 0, 1}) with respect to the first predetermined voltage range code (e.g. the voltage range code {0, 0, 0}) among the series of predetermined voltage range codes 900 can be associated with the distribution shift of the first partial read sensing voltage distribution corresponding to the first aggressor type M1 with respect to the read sensing voltage distribution of the super set M (e.g. at least the first set of memory cells within the any NV memory element), and more particularly, can be regarded as an inverse shift of the first distribution shift Shift_M_to_M1 of the first partial read sensing voltage distribution corresponding to the first aggressor type M1. In addition, for the second aggressor type M0, a second ranking shift of the ranking of the second predetermined voltage range code (e.g. the voltage range code {0, 0, 1}) with respect to the first predetermined voltage range code (e.g. the voltage range code {1, 0, 0}) among the series of predetermined voltage range codes 900 can be associated with the distribution shift of the second partial read sensing voltage distribution corresponding to the second aggressor type M0 with respect to the read sensing voltage distribution of the super set M (e.g. at least the first set of memory cells within the any NV memory element), and more particularly, can be regarded as an inverse shift of the second distribution shift Shift_M_to_M0 of the first partial read sensing voltage distribution corresponding to the second aggressor type M0. For brevity, similar descriptions for this embodiment are not repeated in detail here.

Figure 10:
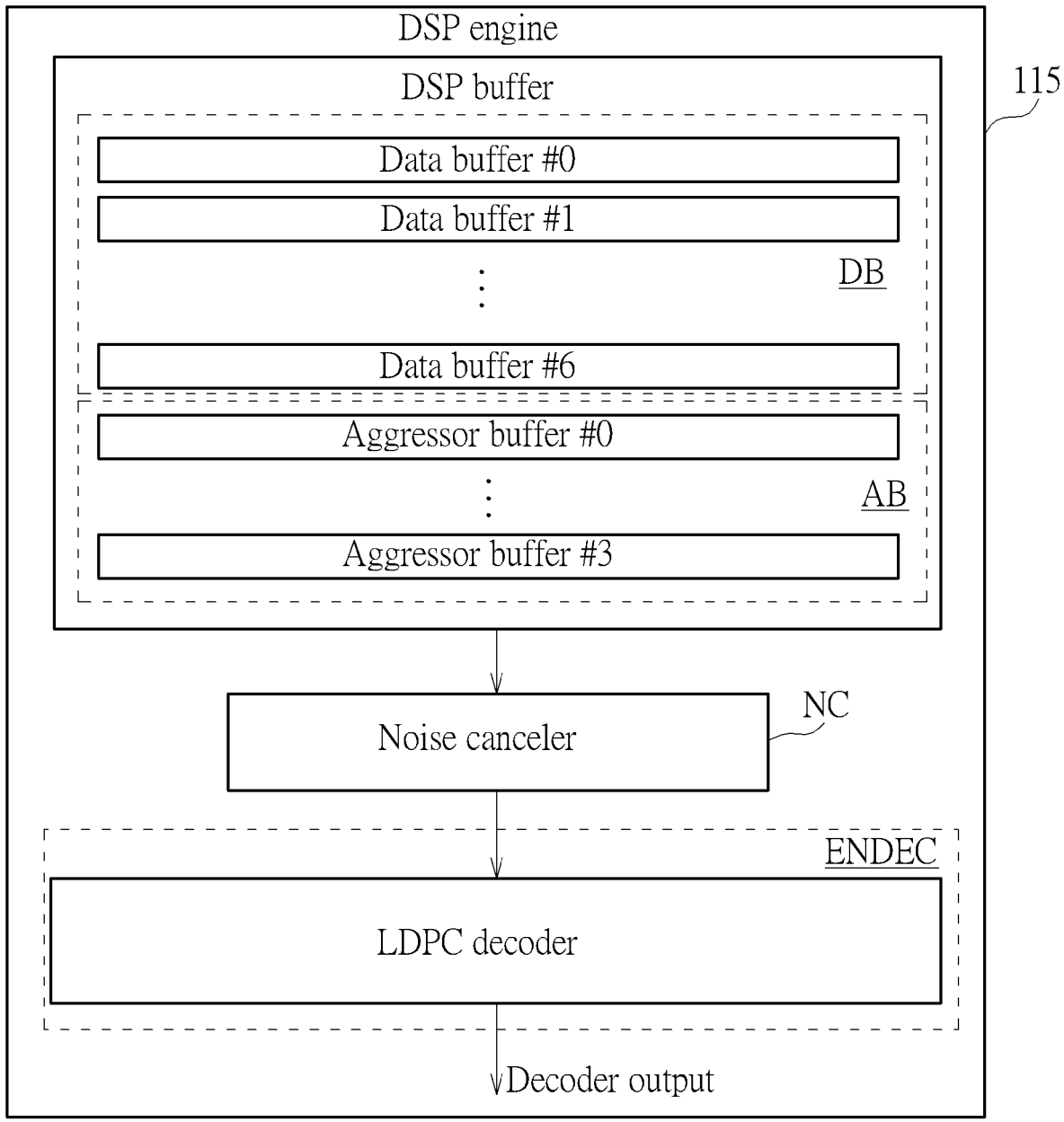
FIG. 10 illustrates a digital signal processing (DSP) control scheme of the method shown in FIG. 6A and FIG. 6B according to an embodiment of the present invention.

FIG. 10 illustrates a DSP control scheme of the method shown in FIG. 6A and FIG. 6B according to an embodiment of the present invention. The DSP engine 115 may comprise a DSP buffer, and the DSP buffer may comprise the multiple data buffers DB and the multiple aggressor buffers AB. For example, the multiple data buffers DB may comprise data buffers #0, #1, . . . and #6, and the multiple aggressor buffers AB may comprise aggressor buffers #0, . . . and #3, but the present invention is not limited thereto. According to some embodiments, the number of the data buffers #0, #1, etc. and/or the number of the aggressor buffers #0, etc. may vary. In addition, the encoder and decoder circuit ENDEC may comprise the decoder such as the LDPC decoder. The memory controller 110 (e.g. the microprocessor 112 and/or the DSP engine 115) can utilize the decoder output (e.g. decoding results) of the LDPC decoder to perform error correction. As shown in FIG. 10, the noise canceler NC can be arranged to receive data pages and aggressor pages from the multiple data buffers DB and the multiple aggressor buffers AB, respectively, and more particularly, operate according various control schemes (e.g. the access control scheme shown in FIG. 7 and the soft-decoding information conversion control scheme shown in FIG. 9) of the method to perform noise canceling. For brevity, similar descriptions for this embodiment are not repeated in detail here.

Figure 11:
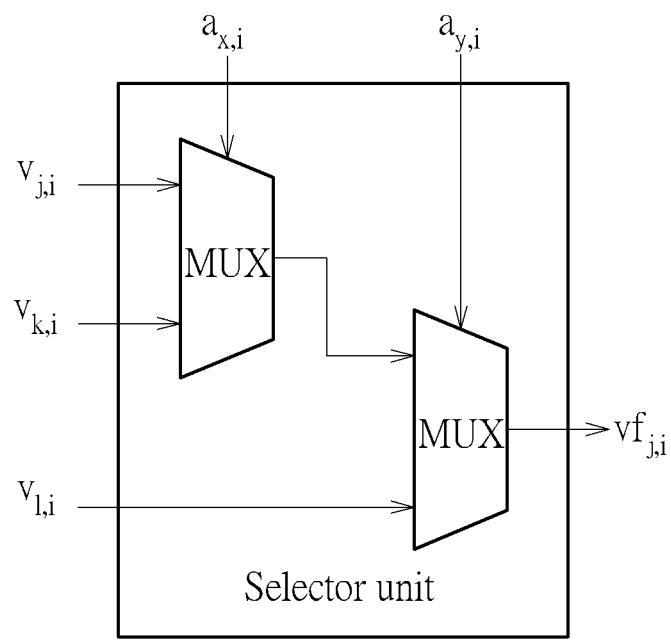
FIG. 11 illustrates some implementation details of the DSP control scheme shown in FIG. 10 according to an embodiment of the present invention.

FIG. 11 illustrates some implementation details of the DSP control scheme shown in FIG. 10 according to an embodiment of the present invention. In the architecture of the DSP engine 115 shown in FIG. 10, the noise canceler NC may comprise at least one selector unit (e.g. one or more selector units) such as the selector unit shown in FIG. 11. The selector unit may comprise multiple multiplexers (MUXs) arranged to select one of multiple inputs such as the input bits $v_{j,i}$, $v_{k,i}$ and $v_{l,i}$ according to multiple selection bits such as the selection bits $a_{x,i}$ and $a_{y,i}$ to be a selection result such as a final bit $vf_{j,i}$.

For better comprehension, assume that the aggressors (e.g. bit information stored in aggressor memory cells) can be classified into an aggressor set A as follows:

A={A0, A1, A2, A3, A4, . . . };

where the aggressor set A starts from the strongest interference type (e.g. the aggressor A0) and is arranged from the strongest interference aggressor causing the strongest interference to the weakest interference aggressor causing the weakest interference, but the present invention is not limited thereto. In some examples, the number of aggressors in the aggressor set A and/or the arrangement thereof may vary. In addition, if at least one weakest interference aggressor causing weakest interference no longer has much impact, the at least one weakest interference aggressor can be omitted.

For example, the aggressor set A and a victim set V (e.g. a set for classifying bit information stored in victim memory cells) can be expressed as follows:

A={A0, A1}; and
V={V0, V1, V2, V3, . . . , Vj};

where any of A0 and A1 may represent a codeword acting as an interference source, and any of V0, V1, etc. may represent a codeword read by using different read sensing voltages. In addition, the above members of the aggressor set A and the victim set V can be expressed as follows:

A0={$a_{0,0}$, $a_{0,1}$, $a_{0,2}$, $a_{0,3}$, $a_{0,CWLENGTH}$};
A1={$a_{1,0}$, $a_{1,1}$, $a_{1,2}$, $a_{1,3}$, $a_{1,CWLENGTH}$};
V0={$v_{0,0}$, $v_{0,1}$, $v_{0,2}$, $v_{0,3}$, $v_{0,CWLENGTH}$};
V1={$v_{1,0}$, $v_{1,1}$, $v_{1,2}$, $v_{1,3}$, $v_{1,CWLENGTH}$}; and
Vj={$v_{j,0}$, $v_{j,1}$, $v_{j,2}$, $v_{j,3}$, $v_{j,CWLENGTH}$};

where the symbol "CWLENGTH" may represent the codeword length of any of these codewords.

In addition, the respective bits of the aggressors A0 and A1 in the aggressor set A can be inputted into the selector unit to be the selection bits $a_{x,i}$ and $a_{y,i}$, and the respective bits of the victims V0, V1, etc. in the victim set V can be inputted into the selector unit to be the input bits $v_{j,i}$, $v_{k,i}$ and $v_{l,i}$, and therefore the selector unit can output the final processing result V_final such as the final bits $\{vf_{j,i}|i=0, 1, \ldots\}$. For brevity, similar descriptions for this embodiment are not repeated in detail here.

According to some embodiments, in the 3D NAND flash memory shown in FIG. 2, for a certain memory cell of the first set of memory cells, the second set of memory cells may comprise all of the memory cells that are adjacent to this memory cell in the direction corresponding to the Z-axis, such as two memory cells that are adjacent to this memory cell, but the present invention is not limited thereto. According to some embodiments, in the 3D NAND flash memory shown in FIG. 2, for a certain memory cell of the first set of memory cells, the second set of memory cells may comprise all of the memory cells that are adjacent to this memory cell in one or more directions of the three directions respectively corresponding to the X-axis, the Y-axis, and the Z-axis. For example, the second set of memory cells may comprise two memory cells that are adjacent to this memory cell in any direction of the three directions respectively corresponding to the X-axis, the Y-axis, and the Z-axis. For another example, the second set of memory cells may comprise six memory cells that are adjacent to this memory cell in the three directions respectively corresponding to the X-axis, the Y-axis, and the Z-axis. For brevity, similar descriptions for these embodiments are not repeated in detail here.

According to some embodiments, in a planar or two-dimensional (2D) NAND flash memory, for a certain memory cell of the first set of memory cells, the second set of memory cells may comprise all of the memory cells that are adjacent to this memory cell in one or more directions of the two directions respectively corresponding to the two axes of the planar architecture. For example, the second set of memory cells may comprise two memory cells that are adjacent to this memory cell in any direction of the two directions respectively corresponding to the two axes. For another example, the second set of memory cells may comprise four memory cells that are adjacent to this memory cell in the two directions respectively corresponding to the two axes. For brevity, similar descriptions for these embodiments are not repeated in detail here.

It is an advantage of the present invention that the method and the associated apparatus provided by the present invention can ensure that the memory device can properly operate under various situations, where examples of the apparatus mentioned above may comprise the memory controller 110, the memory device 100, etc. For example, the most extreme access conditions of the memory devices in use may comprise sudden power failure during use and abrupt variation of the ambient temperature that typically occurs in high-latitude countries or regions. For better comprehension, assume that, when the sudden power failure occurs, a data protection procedure of the memory device 100 cannot be completed, for example, the parity information (e.g. the Redundant Array of Independent Disks (RAID) parity) of a cross-block array cannot be written in time, where one or more previously stored pages in a certain block on a certain physical location may be damaged due to the sudden power failure. It may be helpful to read soft information as much as possible and to use a stronger decoding algorithm in order to try recovering the data. Please note that the memory device 100 (e.g. the memory controller 110) operating according to the method can prevent the problem regarding the bottleneck mentioned above, and more particularly, can prevent the data recovery abandonment problem. In addition, as it is unnecessary to enter a final data recovery procedure using any cross-block check code, the memory device 100 (e.g. the memory controller 110) operating according to the method can prevent the bad block problem, and can prevent the decreased available data storage space problem.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing access control of a memory device with aid of aggressor bit information, the method being applied to a controller of the memory device, the memory device comprising the controller and a non-volatile (NV) memory, the NV memory comprising at least one NV memory element, the at least one NV memory element comprising a plurality of blocks, the method comprising:

receiving a first host read command from a host device, wherein the first host read command indicates reading first data at a first logical address;

in response to the first host read command, sending a first read command to the NV memory in order to try reading the first data from a first page within a first block among the plurality of blocks according to a first physical address associated with the first logical address, wherein the first physical address indicates the first page within the first block, and reading the first data from the first page is unsuccessful;

in response to reading the first data from the first page being unsuccessful, sending a second read command to the NV memory to obtain soft-decoding information regarding the first page and performing a first soft-decoding operation according to the soft-decoding information in order to try obtaining the first data from the first soft-decoding operation, wherein obtaining the first data from the first soft-decoding operation is unsuccessful;

in response to obtaining the first data from the first soft-decoding operation being unsuccessful, reading multiple bits from at least one aggressor page that is different from the first page to be the aggressor bit information, wherein the first page corresponds to a first set of memory cells within any NV memory element of the at least one NV memory element, and the at least one aggressor page corresponds to a second set of memory cells adjacent to the first set of memory cells within the any NV memory element;

converting the soft-decoding information into adjusted soft-decoding information according to the aggressor bit information of the at least one aggressor page; and performing a second soft-decoding operation according to the adjusted soft-decoding information to obtain the first data from the second soft-decoding operation.

2. The method of claim 1, further comprising:

in response to the first host read command, performing address mapping on the first logical address according to at least one logical-to-physical (L2P) address mapping table to obtain the first physical address associated with the first logical address, wherein the at least one L2P address mapping table comprises mapping relationships between multiple logical addresses and multiple physical addresses, the first logical address is one of the multiple logical addresses, and the first physical address is one of the multiple physical addresses.

3. The method of claim 1, wherein for any bit of the first data, the soft-decoding information corresponding to the any bit comprises a sign bit and multiple soft bits.

4. The method of claim 1, wherein a series of predetermined voltage range codes are used for representing a series of voltage ranges of a read sensing voltage of the NV memory, respectively; and for any bit of the first data, the soft-decoding information corresponding to the any bit comprises a first predetermined voltage range code among the series of predetermined voltage range codes.

5. The method of claim 4, wherein converting the soft-decoding information into adjusted soft-decoding information according to the aggressor bit information of the at least one aggressor page further comprises:
  regarding determining the any bit of the first data, switching from the first predetermined voltage range code to a second predetermined voltage range code among the series of predetermined voltage range codes according to a corresponding bit within the aggressor bit information, for being used as the adjusted soft-decoding information corresponding to the any bit.

6. The method of claim 5, wherein a ranking shift of ranking of the second predetermined voltage range code with respect to the first predetermined voltage range code among the series of predetermined voltage range codes is associated with a distribution shift of a partial read sensing voltage distribution corresponding to a predetermined aggressor type with respect to a read sensing voltage distribution of at least the first set of memory cells within the any NV memory element.

7. The method of claim 4, wherein any predetermined voltage range code among the series of predetermined voltage range codes comprises a sign bit and multiple soft bits.

8. The method of claim 1, wherein converting the soft-decoding information into the adjusted soft-decoding information according to the aggressor bit information of the at least one aggressor page and performing the second soft-decoding operation according to the adjusted soft-decoding information to obtain the first data from the second soft-decoding operation are performed in a bit-by-bit manner.

9. The method of claim 8, wherein regarding determining any bit of the first data, an operation of converting the soft-decoding information corresponding to the any bit into the adjusted soft-decoding information corresponding to the any bit according to at least one associated bit within the aggressor bit information of the at least one aggressor page is performed based on a distribution shift of a partial read sensing voltage distribution corresponding to a predetermined aggressor type with respect to a read sensing voltage distribution of at least the first set of memory cells within the any NV memory element.

10. A memory device, comprising:
  a non-volatile (NV) memory, configured to store information, wherein the NV memory comprises at least one NV memory element, and the at least one NV memory element comprises a plurality of blocks; and
  a controller, coupled to the NV memory, configured to control operations of the memory device, wherein the controller comprises:
    a processing circuit, configured to control the controller according to a plurality of host commands from a host device, to allow the host device to access the NV memory through the controller;
  wherein:
    the controller receives a first host read command from the host device, wherein the first host read command indicates reading first data at a first logical address, and the first host read command is one of the plurality of host commands;
    in response to the first host read command, the controller sends a first read command to the NV memory in order to try reading the first data from a first page within a first block among the plurality of blocks according to a first physical address associated with the first logical address, wherein the first physical address indicates the first page within the first block, and reading the first data from the first page is unsuccessful;
    in response to reading the first data from the first page being unsuccessful, the controller sends a second read command to the NV memory to obtain soft-decoding information regarding the first page and performs a first soft-decoding operation according to the soft-decoding information in order to try obtaining the first data from the first soft-decoding operation, wherein obtaining the first data from the first soft-decoding operation is unsuccessful;
    in response to obtaining the first data from the first soft-decoding operation being unsuccessful, the controller reads multiple bits from at least one aggressor page that is different from the first page to be the aggressor bit information, wherein the first page corresponds to a first set of memory cells within any NV memory element of the at least one NV memory element, and the at least one aggressor page corresponds to a second set of memory cells adjacent to the first set of memory cells within the any NV memory element;
    the controller converts the soft-decoding information into adjusted soft-decoding information according to the aggressor bit information of the at least one aggressor page; and
    the controller performs a second soft-decoding operation according to the adjusted soft-decoding information to obtain the first data from the second soft-decoding operation.

11. A controller of a memory device, the memory device comprising the controller and a non-volatile (NV) memory, the NV memory comprising at least one NV memory element, the at least one NV memory element comprising a plurality of blocks, the controller comprising:
  a processing circuit, configured to control the controller according to a plurality of host commands from a host device, to allow the host device to access the NV memory through the controller;
  wherein:
    the controller receives a first host read command from the host device, wherein the first host read command indicates reading first data at a first logical address, and the first host read command is one of the plurality of host commands;
    in response to the first host read command, the controller sends a first read command to the NV memory in order to try reading the first data from a first page within a first block among the plurality of blocks according to a first physical address associated with the first logical address, wherein the first physical address indicates the first page within the first block, and reading the first data from the first page is unsuccessful;
    in response to reading the first data from the first page being unsuccessful, the controller sends a second read command to the NV memory to obtain soft-decoding information regarding the first page and performs a first soft-decoding operation according to the soft-decoding information in order to try obtaining the first data from the first soft-decoding operation, wherein obtaining the first data from the first soft-decoding operation is unsuccessful;

in response to obtaining the first data from the first soft-decoding operation being unsuccessful, the controller reads multiple bits from at least one aggressor page that is different from the first page to be the aggressor bit information, wherein the first page corresponds to a first set of memory cells within any NV memory element of the at least one NV memory element, and the at least one aggressor page corresponds to a second set of memory cells adjacent to the first set of memory cells within the any NV memory element;

the controller converts the soft-decoding information into adjusted soft-decoding information according to the aggressor bit information of the at least one aggressor page; and the controller performs a second soft-decoding operation according to the adjusted soft-decoding information to obtain the first data from the second soft-decoding operation.

* * * * *